(12) United States Patent
Shimizu

(10) Patent No.: US 11,450,746 B2
(45) Date of Patent: Sep. 20, 2022

(54) SEMICONDUCTOR DEVICE, METHOD FOR MANUFACTURING SEMICONDUCTOR DEVICE, INVERTER CIRCUIT, DRIVE DEVICE, VEHICLE, AND ELEVATOR

(71) Applicant: KABUSHIKI KAISHA TOSHIBA, Tokyo (JP)

(72) Inventor: Tatsuo Shimizu, Shinagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/189,412

(22) Filed: Mar. 2, 2021

(65) Prior Publication Data

US 2022/0085169 A1 Mar. 17, 2022

(30) Foreign Application Priority Data

Sep. 15, 2020 (JP) .............................. JP2020-155005

(51) Int. Cl.
| | | |
|---|---|---|
| H01L 29/16 | (2006.01) | |
| H01L 29/167 | (2006.01) | |
| H01L 29/872 | (2006.01) | |
| H01L 21/04 | (2006.01) | |
| H01L 29/78 | (2006.01) | |

(52) U.S. Cl.
CPC ........ *H01L 29/1608* (2013.01); *H01L 21/046* (2013.01); *H01L 29/167* (2013.01); *H01L 29/7802* (2013.01); *H01L 29/872* (2013.01)

(58) Field of Classification Search
None
See application file for complete search history.

(56) References Cited

U.S. PATENT DOCUMENTS

| | | |
|---|---|---|
| 9,601,581 B2 | 3/2017 | Shimizu et al. |
| 10,249,718 B2 | 4/2019 | Shimizu et al. |
| 2012/0228630 A1 | 9/2012 | Shimizu et al. |

(Continued)

FOREIGN PATENT DOCUMENTS

| | | |
|---|---|---|
| JP | 2012-186324 A | 9/2012 |
| JP | 2015-185616 A | 10/2015 |

(Continued)

OTHER PUBLICATIONS

Tanimoto et al., "Toward a better understanding of Ni$_2$Si-based contact on SiC", ECSCRM, 2010, abstract, Tue-P-48, TP-151, p. 152.

*Primary Examiner* — Jack S Chen
(74) *Attorney, Agent, or Firm* — Oblon, McClelland, Maier & Neustadt, L.L.P.

(57) ABSTRACT

A semiconductor device of an embodiment includes a first electrode; a second electrode; and a silicon carbide layer disposed between the first electrode and the second electrode, and includes a first silicon carbide region of n-type; and a second silicon carbide region disposed between the first silicon carbide region and the first electrode, in contact with the first electrode, containing an at least one element selected from the group consisting of sulfur (S), selenium (Se), tellurium (Te), titanium (Ti), zirconium (Zr), hafnium (Hf), vanadium (V), niobium (Nb), tantalum (Ta), chromium (Cr), molybdenum (Mo), and tungsten (W), and containing at least one first atom of the at least one element, the first atom being bonded to four silicon atoms.

18 Claims, 38 Drawing Sheets

(56) References Cited

U.S. PATENT DOCUMENTS

2018/0308936 A1    10/2018  Shimizu et al.
2021/9353098          11/2021  Shimizu
2022/0085169 A1*   3/2022  Shimizu .............. H01L 29/7805
2022/0085170 A1*   3/2022  Shimizu .............. H01L 29/0856

FOREIGN PATENT DOCUMENTS

JP    2018-186125 A    11/2018
JP    2018-186126 A    11/2018
JP    2021-180262 A    11/2021

* cited by examiner

SEMICONDUCTOR DEVICE, METHOD FOR MANUFACTURING SEMICONDUCTOR DEVICE, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2020-155005, filed on Sep. 15, 2020, the entire contents of which are incorporated herein by reference.

FIELD

Embodiments described herein relate generally to a semiconductor device, a method for manufacturing a semiconductor device, an inverter circuit, a drive device, a vehicle, and an elevator.

BACKGROUND

Silicon carbide (SiC) is expected as a material for a next-generation semiconductor device. Silicon carbide has such excellent physical properties that a bandgap is three times that of silicon (Si), a breakdown field strength is about ten times that of silicon, and a thermal conductivity is about three times that of silicon. By using this characteristic, a semiconductor device having low loss and capable of being operated at a high temperature can be achieved.

In a Schottky barrier diode (SBD) using silicon carbide, when a Schottky barrier height between a silicon carbide layer and an electrode varies, rectification characteristics of the SBD vary. Therefore, it is desired to achieve a semiconductor device that suppresses variation in Schottky barrier height.

DETAILED DESCRIPTION

Figure 1:
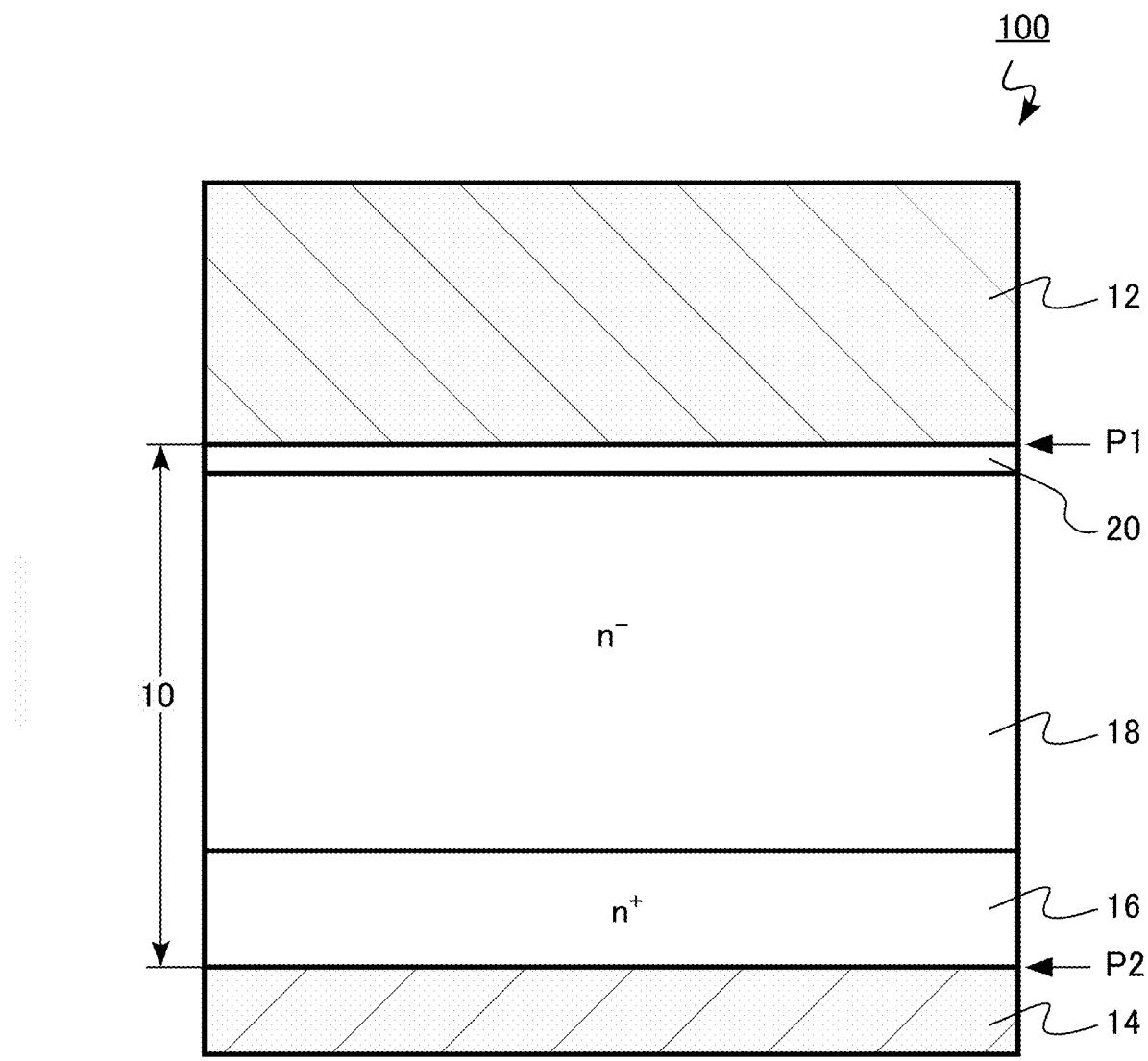
FIG. 1 is a schematic cross sectional view of a semiconductor device of a first embodiment.

A semiconductor device of an embodiment includes: a first electrode; a second electrode; and a silicon carbide layer disposed between the first electrode and the second electrode, and the silicon carbide layer including: a first silicon carbide region of n-type; and a second silicon carbide region disposed between the first silicon carbide region and the first electrode, the second silicon carbide region being in contact with the first electrode, the second silicon carbide region containing at least one element selected from the group consisting of sulfur (S), selenium (Se), tellurium (Te), titanium (Ti), zirconium (Zr), hafnium (Hf), vanadium (V), niobium (Nb), tantalum (Ta), chromium (Cr), molybdenum (Mo), and tungsten (W), the second silicon carbide region containing at least one first atom of the at least one element, and the first atom being bonded to four silicon atoms.

Hereinafter, embodiments of the present disclosure will be described with reference to the drawings. Note that in the following description, the same sign will be given to the same or similar members and the like, and description of a member or the like described once will be omitted appropriately.

In the following description, each of $n^+$, n, $n^-$, $p^+$, p, and $p^-$ indicates a relative magnitude of an impurity concentration in each conductive type. That is, it is indicated that $n^+$ has a relatively higher n-type impurity concentration than n and that $n^-$ has a relatively lower n-type impurity concentration than n. It is indicated that $p^+$ has a relatively higher p-type impurity concentration than p and that $p^-$ has a relatively lower p-type impurity concentration than p. Note that an $n^+$ type or an $n^-$ type may be referred to simply as an n type. A $p^+$ type or a $p^-$ type may be referred to simply as a p type. Unless otherwise specified, the impurity concentration in each region is represented by, for example, a value of the impurity concentration in a central portion of each region.

The impurity concentration can be measured by, for example, secondary ion mass spectrometry (SIMS). The relative magnitude of the impurity concentration can be determined from, for example, the magnitude of a carrier concentration determined by scanning capacitance microscopy (SCM). A distance such as the width or depth of an impurity region can be determined by, for example, SIMS. A distance such as the width or depth of the impurity region can be determined from, for example, an SCM image.

The depth of a trench, the thickness of an insulating layer, and the like can be measured, for example, by SIMS or on an image of a transmission electron microscope (TEM).

A bonding state of a specific atom in the silicon carbide layer can be identified by X-ray photoelectron spectroscopy (XPS method). In addition, whether an atom of a specific element in the silicon carbide layer is positioned at a silicon site or a carbon site of a crystal structure of silicon carbide can be determined by, for example, Raman spectroscopy.

First Embodiment

A semiconductor device of a first embodiment includes: a first electrode; a second electrode; and a silicon carbide layer disposed between the first electrode and the second electrode, and the silicon carbide layer including: a first silicon carbide region of n-type; and a second silicon carbide region disposed between the first silicon carbide region and the first electrode, the second silicon carbide region being in contact with the first electrode, the second silicon carbide region containing at least one element selected from the group consisting of sulfur (S), selenium (Se), tellurium (Te), titanium (Ti), zirconium (Zr), hafnium (Hf), vanadium (V), niobium (Nb), tantalum (Ta), chromium (Cr), molybdenum (Mo), and tungsten (W), the second silicon carbide region containing at least one first atom of the at least one element, and the first atom being bonded to four silicon atoms.

Hereinafter, a case where the element contained in the second silicon carbide region is sulfur (S) will be exemplified.

FIG. 1 is a schematic cross-sectional view of the semiconductor device of the first embodiment; The semiconductor device of the first embodiment is a Schottky barrier diode (SBD). The semiconductor device of the first embodiment is an SBD 100. The SBD 100 uses electrons as carriers.

The SBD 100 includes a silicon carbide layer 10, an anode electrode 12 (first electrode), and a cathode electrode 14 (second electrode).

The anode electrode 12 is an example of the first electrode. The cathode electrode 14 is an example of the second electrode.

The silicon carbide layer 10 includes a cathode region 16, a drift region 18 (first silicon carbide region), and a sulfur region 20 (second silicon carbide region).

The silicon carbide layer 10 is made of, for example, a single crystal of 4H—SiC. The silicon carbide layer 10 has a first plane P1 and a second plane P2. The second plane P2 faces the first plane P1. The first plane P1 is a front surface of the silicon carbide layer 10, and the second plane P2 is a back surface of the silicon carbide layer 10.

The silicon carbide layer 10 is disposed between the anode electrode 12 and the cathode electrode 14.

Here, the term "depth" means a distance from the first plane P1 in a direction going from the first plane P1 to the second plane P2.

Hereinafter, a case where the first plane P1 of the silicon carbide layer 10 is inclined by 0 degrees or more and 10 degrees or less with respect to a silicon face and the second plane P2 is inclined by 0 degrees or more and 10 degrees or less with respect to a carbon face will be exemplified. The first plane P1 of the silicon carbide layer 10 has an off angle of 0 degrees or more and 10 degrees or less with respect to the silicon face.

The cathode region 16 is made of SiC of $n^1$ type. For example, the cathode region 16 contains nitrogen (N) as n-type impurities. The n-type impurity concentration in the cathode region 16 is, for example, $1\times10^{18}$ cm$^{-3}$ or more and $1\times10^{21}$ cm$^{-3}$ or less.

The drift region 18 is made of SiC of $n^-$ type. The drift region 18 is disposed between the cathode region 16 and the anode electrode 12. The drift region 18 is disposed between the cathode region 16 and the first plane P1.

The drift region 18 contains, for example, nitrogen (N) as n-type impurities. The n-type impurity concentration in the drift region 18 is, for example, $1\times10^{15}$ cm$^{-3}$ or more and $2\times10^{16}$ cm$^{-3}$ or less. The n-type impurity concentration in the drift region 18 is lower than the n-type impurity concentration in the cathode region 16.

The drift region 18 is, for example, a SiC epitaxial growth layer formed on the cathode region 16 by epitaxial growth. The drift region 18 has a thickness, for example, of 5 μm or more and 100 μm or less.

The sulfur region 20 is made of SiC of $n^-$ type. The sulfur region 20 is disposed between the drift region 18 and the anode electrode 12. The sulfur region 20 is disposed between the drift region 18 and the first plane P1. The sulfur region 20 is in contact with the anode electrode 12.

The sulfur region 20 contains sulfur as impurities. A maximum concentration of sulfur in the sulfur region 20 is, for example, $1 \times 10^{17}$ cm$^{-3}$ or more and $1 \times 10^{22}$ cm$^{-3}$ or less.

The sulfur region 20 contains at least one sulfur atom bonded to four silicon atoms.

The sulfur region 20 contains, for example, nitrogen (N) as n-type impurities. The n-type impurity concentration in the sulfur region 20 is, for example, $1 \times 10^{15}$ cm$^{-3}$ or more and $2 \times 10^{16}$ cm$^{-3}$ or less.

Figure 2A:
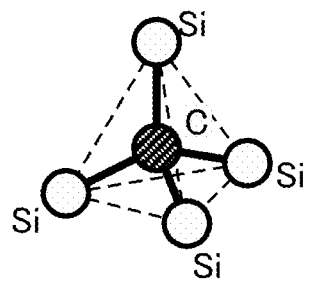
FIGS. 2A, 2B, and 2C are explanatory diagrams of a sulfur region in the first embodiment.
Figure 2B:
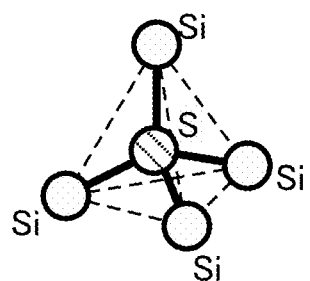
Figure 2C:
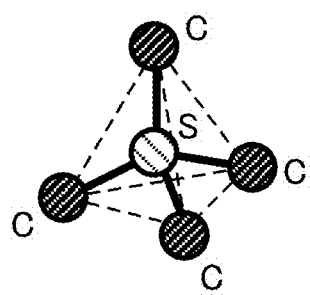

FIGS. 2A, 2B, and 2C are explanatory diagrams of the sulfur region in the first embodiment. FIG. 2A is a diagram illustrating a crystal structure of silicon carbide. FIG. 2B is a diagram illustrating a structure present in the sulfur region 20. FIG. 2C is a diagram illustrating a structure present or absent in the sulfur region 20.

As illustrated in FIG. 2B, there is one sulfur atom bonded to four silicon atoms in the sulfur region 20. In other words, there is one sulfur atom positioned at a carbon site of the crystal structure of silicon carbide illustrated in FIG. 2A in the sulfur region 20. In other words, the sulfur region 20 has a structure in which the carbon atom in the crystal structure of silicon carbide is replaced with one sulfur atom. One sulfur atom bonded to four silicon atoms is an example of the first atom.

FIG. 2C illustrates one sulfur atom bonded to four carbon atoms. FIG. 2C illustrates one sulfur atom positioned at a silicon site of the crystal structure of silicon carbide. FIG. 2C illustrates a structure in which the silicon atom in the crystal structure of silicon carbide is replaced with one sulfur atom. One sulfur atom bonded to four carbon atoms is an example of the second atom.

One sulfur atom bonded to four carbon atoms is contained or not contained in the sulfur region 20. Among sulfur atoms contained in the sulfur region 20, the ratio of sulfur atoms each bonded to four silicon atoms is higher than the ratio of sulfur atoms each bonded to four carbon atoms. Among sulfur atoms contained in the sulfur region 20, for example, the ratio of sulfur atoms each bonded to four silicon atoms is 90% or more.

Figure 3:
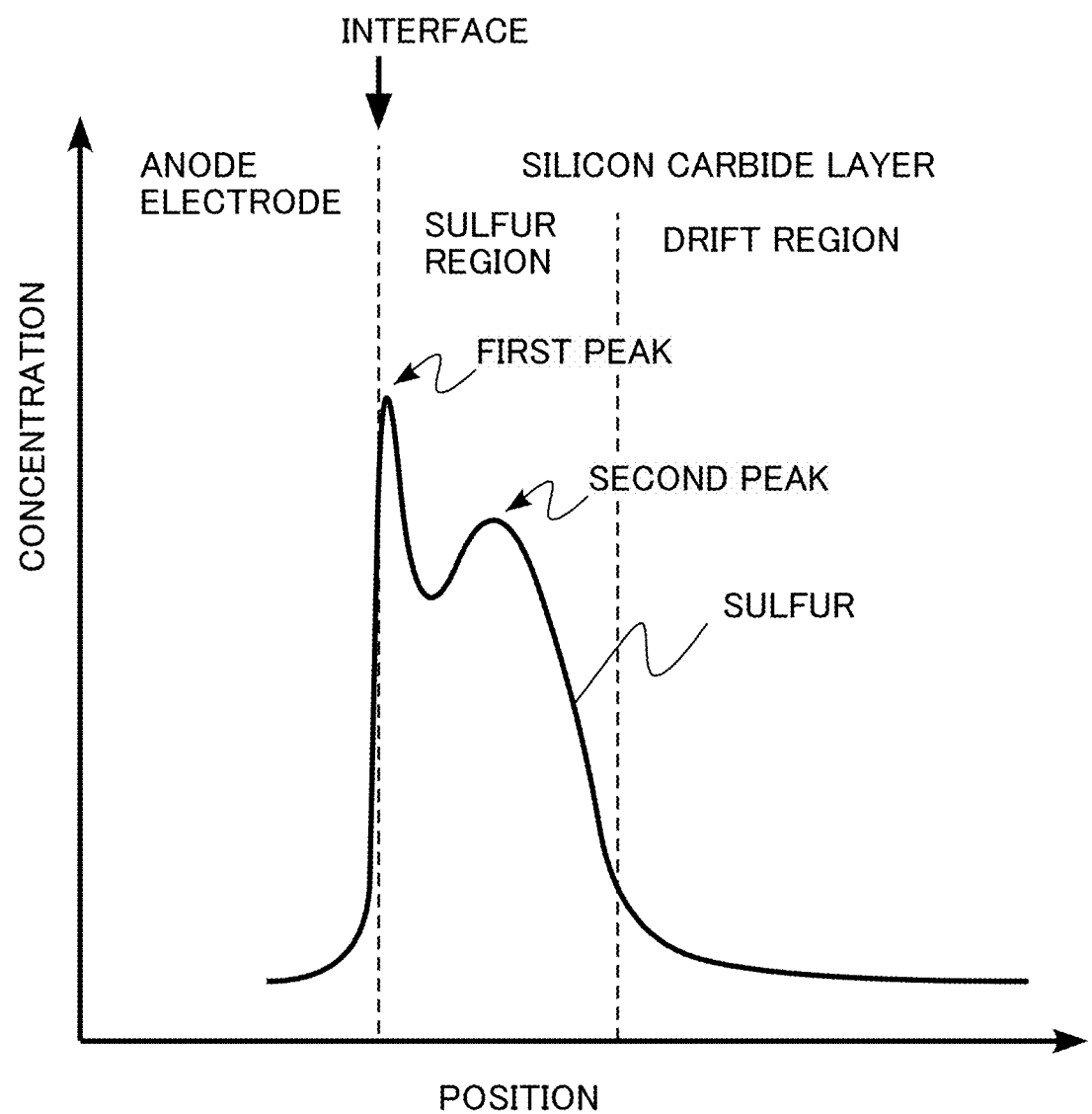
FIG. 3 is a diagram illustrating a concentration distribution of sulfur in the semiconductor device of the first embodiment.

FIG. 3 is a diagram illustrating a concentration distribution of sulfur in the semiconductor device of the first embodiment. FIG. 3 illustrates a concentration distribution of sulfur in the anode electrode 12 and the silicon carbide layer 10 in the depth direction. FIG. 3 illustrates a concentration distribution of sulfur in the anode electrode 12, the sulfur region 20, and the drift region 18 in the depth direction.

The concentration distribution of sulfur in the anode electrode 12 and the sulfur region 20 has a first peak. A distance between an interface between the anode electrode 12 and the sulfur region 20 and the first peak is 50 nm or less. In the sulfur region 20, sulfur is piled up at the interface between the anode electrode 12 and the sulfur region 20.

The sulfur concentration at the first peak is, for example, $1 \times 10^{17}$ cm$^{-3}$ or more and $1 \times 10^{22}$ cm$^{-3}$ or less.

The concentration distribution of sulfur in the anode electrode 12 and the sulfur region 20 has a second peak between the first peak and the drift region 18. The sulfur concentration at the second peak is lower than, for example, the sulfur concentration at the first peak.

The anode electrode 12 is disposed on a side of the first plane P1 of the silicon carbide layer 10. The anode electrode 12 is electrically connected to the sulfur region 20 and the drift region 18.

The anode electrode 12 is in contact with the silicon carbide layer 10. The anode electrode 12 is in contact with the sulfur region 20.

The anode electrode 12 is in Schottky-contact with the sulfur region 20. A Schottky barrier height between the anode electrode 12 and the sulfur region 20 is, for example, 0.8 eV or more and 1.0 eV or less. The Schottky barrier height between the anode electrode 12 and the sulfur region 20 is, for example, about 0.9 eV.

The anode electrode 12 is made of a conductor. The anode electrode 12 is made of, for example, a metal, an intermetallic compound, a metal nitride, a metal silicide, or a semiconductor.

The anode electrode 12 may have, for example, a stacked structure. The anode electrode 12 has, for example, a stacked structure of two different types of metals. The anode electrode 12 has, for example, a stacked structure of a metal silicide and a metal.

The anode electrode 12 has, for example, a stacked structure of titanium and aluminum. The anode electrode 12 contains, for example, nickel silicide. The anode electrode 12 has, for example, a stacked structure of nickel silicide and aluminum.

The cathode electrode 14 is disposed on a side of the second plane P2 of the silicon carbide layer 10. The cathode electrode 14 is in contact with the cathode region 16. The cathode electrode 14 is electrically connected to the cathode region 16.

The cathode electrode 14 is made of a conductor. The cathode electrode 14 is made of, for example, a metal, an intermetallic compound, a metal nitride, a metal silicide, or a semiconductor.

The cathode electrode 14 is made of, for example, nickel. Nickel may react with the silicon carbide layer 10 to form nickel silicide. Nickel silicide is, for example, NiSi or Ni$_2$Si.

Next, an example of a method for manufacturing the semiconductor device of the first embodiment will be described.

In the method for manufacturing the semiconductor device of the first embodiment, first ion implantation of implanting an element selected from the group consisting of sulfur (S), selenium (Se), tellurium (Te), titanium (Ti), zirconium (Zr), hafnium (Hf), vanadium (V), niobium (Nb), tantalum (Ta), chromium (Cr), molybdenum (Mo), and tungsten (W) into a silicon carbide layer having a first silicon carbide region of n-type is performed, second ion implantation of implanting silicon (Si) into the silicon carbide layer is performed, a conductive film is formed on the silicon carbide layer, and a first heat treatment is performed. Before the conductive film is formed, third ion implantation of implanting carbon (C) into the silicon carbide layer is performed. After the first ion implantation, the second ion implantation, and the third ion implantation and before formation of the conductive film, a second heat treatment in which the temperature is higher than that in the first heat treatment is performed. After the first ion implantation, the second ion implantation, and the third ion implantation and before the second heat treatment, a carbon film is formed on the silicon carbide layer. Before the first ion implantation, the second ion implantation, and the third ion implantation, an oxide film is formed on the silicon carbide layer. After the first ion implantation, the second ion implantation, and the third ion implantation and before formation of the conductive film, the oxide film is removed. The temperature in the first heat treatment is 300° C. or higher and 700° C. or lower.

Figure 4:
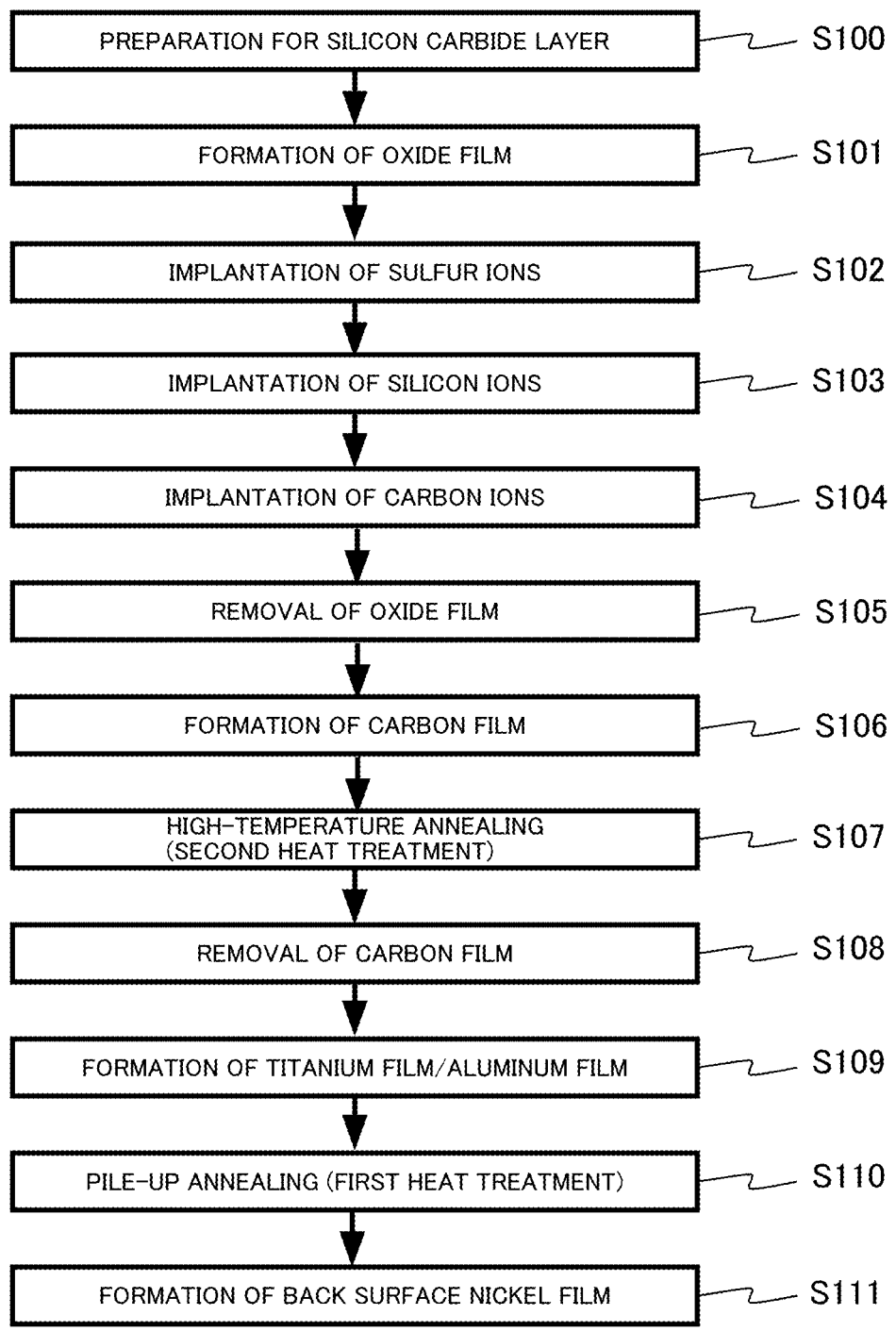
FIG. 4 is a process flow chart illustrating a method for manufacturing the semiconductor device of the first embodiment.

FIG. 4 is a process flow chart illustrating the method for manufacturing the semiconductor device of the first embodiment. FIGS. 5, 6, 7, 8, 9, 10, 11, 12, 13, and 14 are explanatory diagrams of the method for manufacturing the semiconductor device of the first embodiment.

Hereinafter, a case where the anode electrode 12 has a stacked structure of titanium and aluminum and the cathode electrode 14 is made of nickel will be exemplified.

As illustrated in FIG. 4, the method for manufacturing the semiconductor device includes preparation for silicon carbide layer (step S100), formation of oxide film (step S101), implantation of sulfur ions (step S102), implantation of silicon ions (step S103), implantation of carbon ions (step S104), removal of oxide film (step S105), formation of carbon film (step S106), high-temperature annealing (step S107), removal of carbon film (step S108), formation of titanium film/aluminum film (step S109), pile-up annealing (step S110), and formation of back surface nickel film (step S111).

Figure 5:
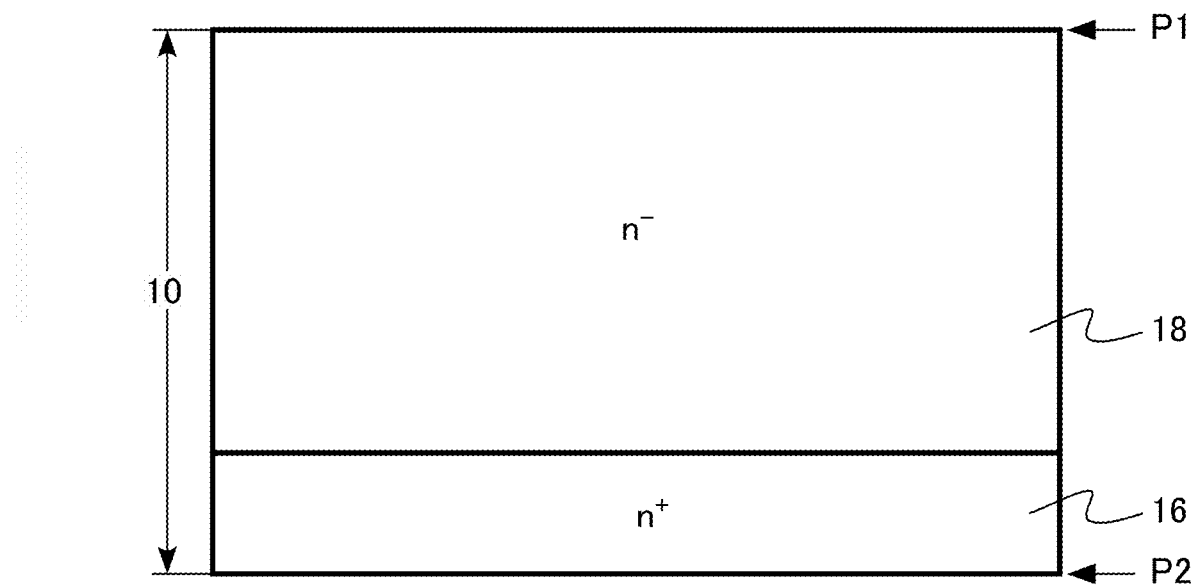
FIG. 5 is an explanatory diagram of the method for manufacturing the semiconductor device of the first embodiment.

In step S100, the silicon carbide layer 10 is prepared (FIG. 5). The silicon carbide layer 10 includes the cathode region 16 of $n^+$ type and the drift region 18 of $n^-$ type. The drift region 18 is formed, for example, on the cathode region 16 of $n^+$ type by an epitaxial growth method. The silicon carbide layer 10 has the first plane P1 and the second plane P2.

Figure 6:
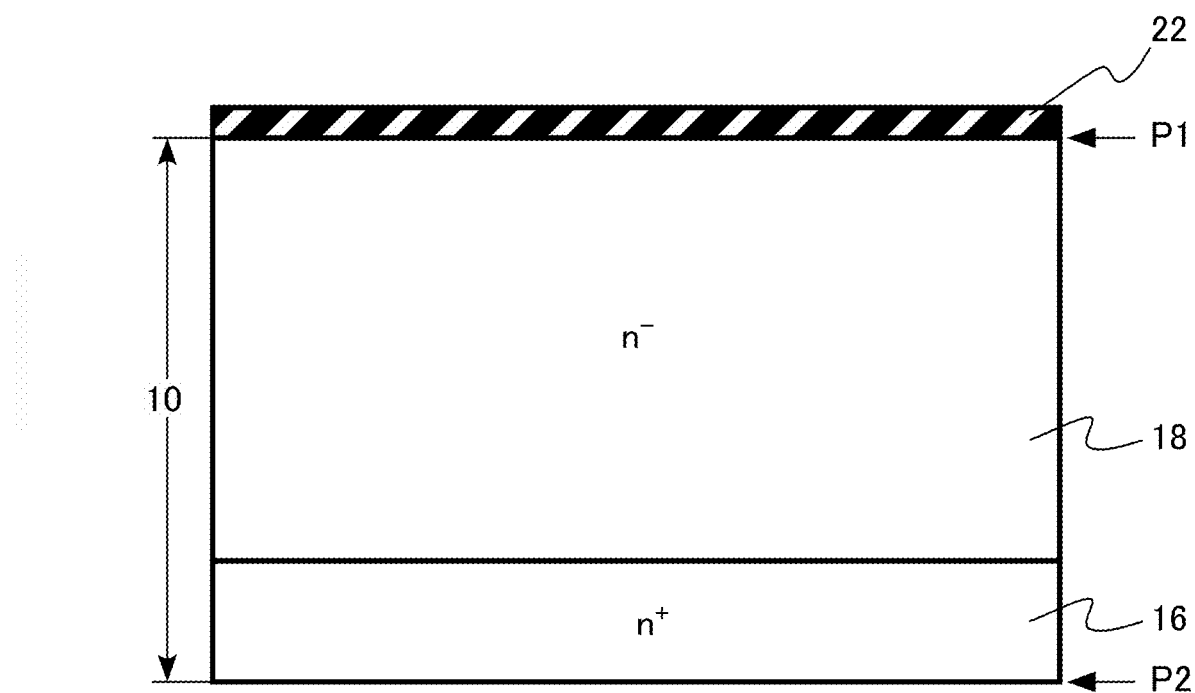
FIG. 6 is an explanatory diagram of the method for manufacturing the semiconductor device according to the first embodiment.

In step S101, an oxide film 22 is formed on the silicon carbide layer 10 (FIG. 6). The oxide film 22 is formed by a chemical vapor deposition method (CVD method) or a thermal oxidation method.

Figure 7:
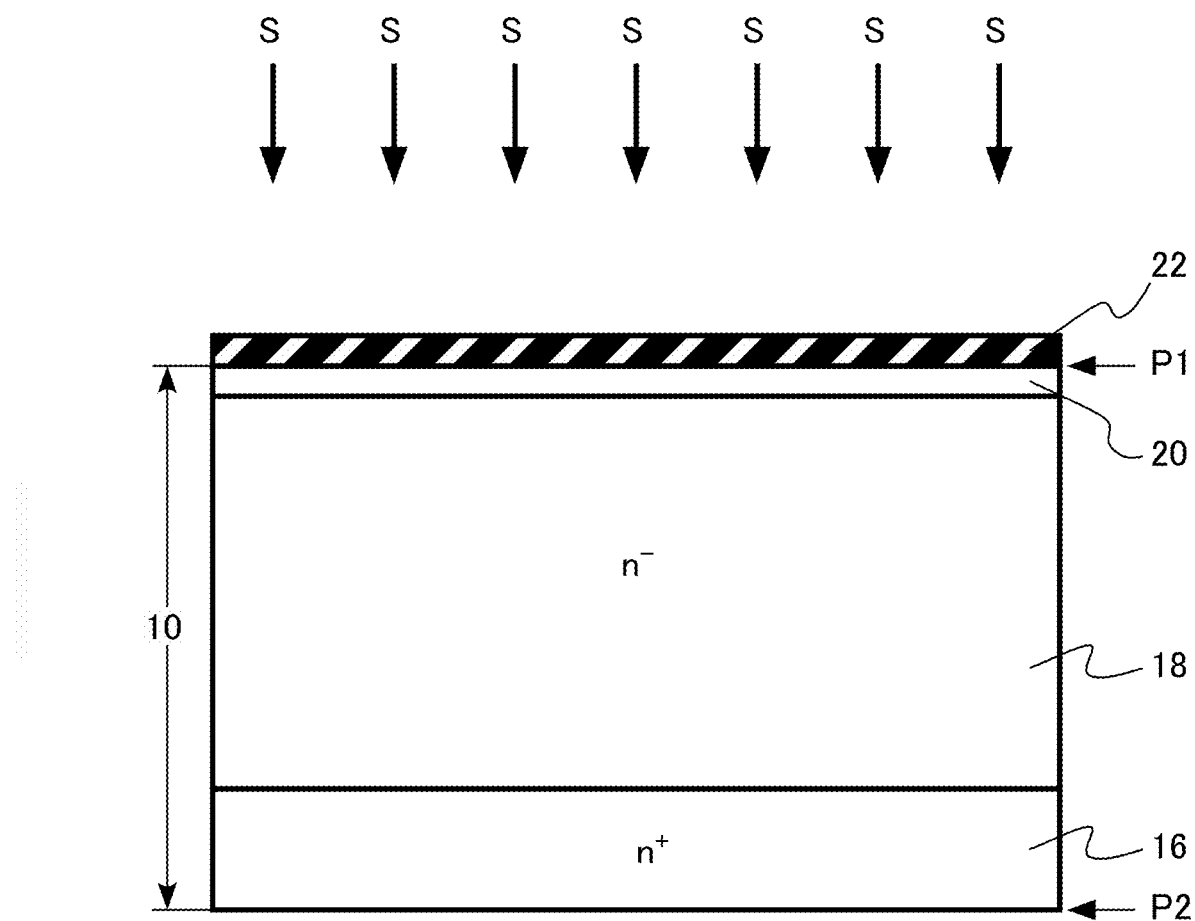
FIG. 7 is an explanatory diagram of the method for manufacturing the semiconductor device of the first embodiment.

In step S102, the first ion implantation of implanting sulfur (S) into the silicon carbide layer 10 is performed (FIG. 7). Sulfur ions that have passed through the oxide film 22 are introduced into the silicon carbide layer 10. By the ion implantation of sulfur, a carbon bond in the silicon carbide layer 10 is broken, and carbon vacancy in the silicon carbide layer 10 increases.

By the first ion implantation of sulfur, the sulfur-containing sulfur region 20 is formed.

Figure 8:
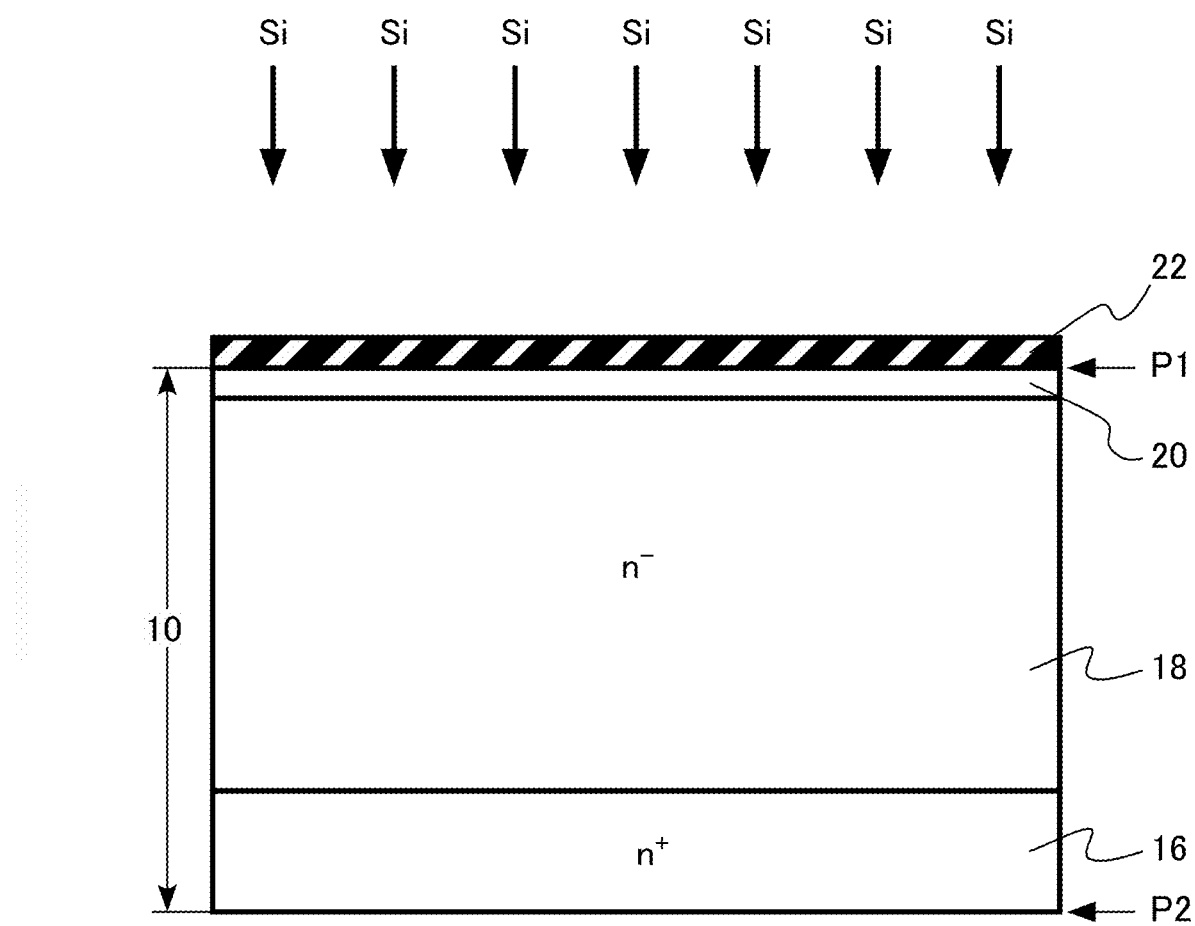
FIG. 8 is an explanatory diagram of the method for manufacturing the semiconductor device of the first embodiment.

In step S103, the second ion implantation of implanting silicon (Si) into the silicon carbide layer 10 is performed (FIG. 8). Silicon ions that have passed through the oxide film 22 are introduced into the silicon carbide layer 10. By the ion implantation of silicon, a carbon bond in the silicon carbide layer 10 is broken, and carbon vacancy in the silicon carbide layer 10 increases.

Silicon introduced into the silicon carbide layer 10 suppresses entry of a sulfur atom into a silicon site in the crystal structure of silicon carbide during high-temperature annealing to be performed later, and promotes entry of a sulfur atom into a carbon site in the crystal structure of silicon carbide.

Figure 9:
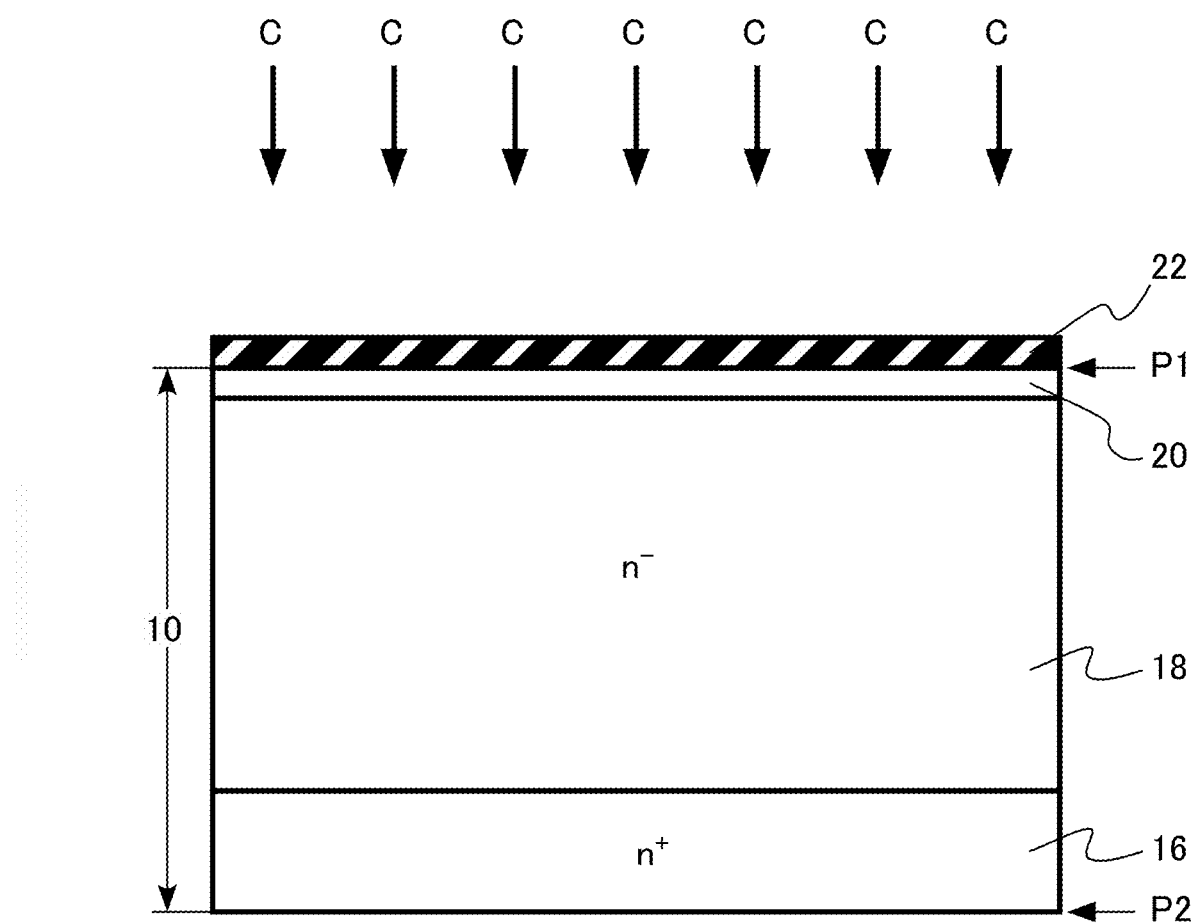
FIG. 9 is an explanatory diagram of the method for manufacturing the semiconductor device of the first embodiment.

In step S104, the third ion implantation of implanting carbon (C) into the silicon carbide layer 10 is performed (FIG. 9). Carbon ions that have passed through the oxide film 22 are introduced into the silicon carbide layer 10.

Carbon introduced into the silicon carbide layer 10 suppresses diffusion of sulfur atoms into a deep position of the silicon carbide layer 10 during high-temperature annealing to be performed later.

Note that the first ion implantation, the second ion implantation, and the third ion implantation are performed in arbitrary order.

Figure 10:
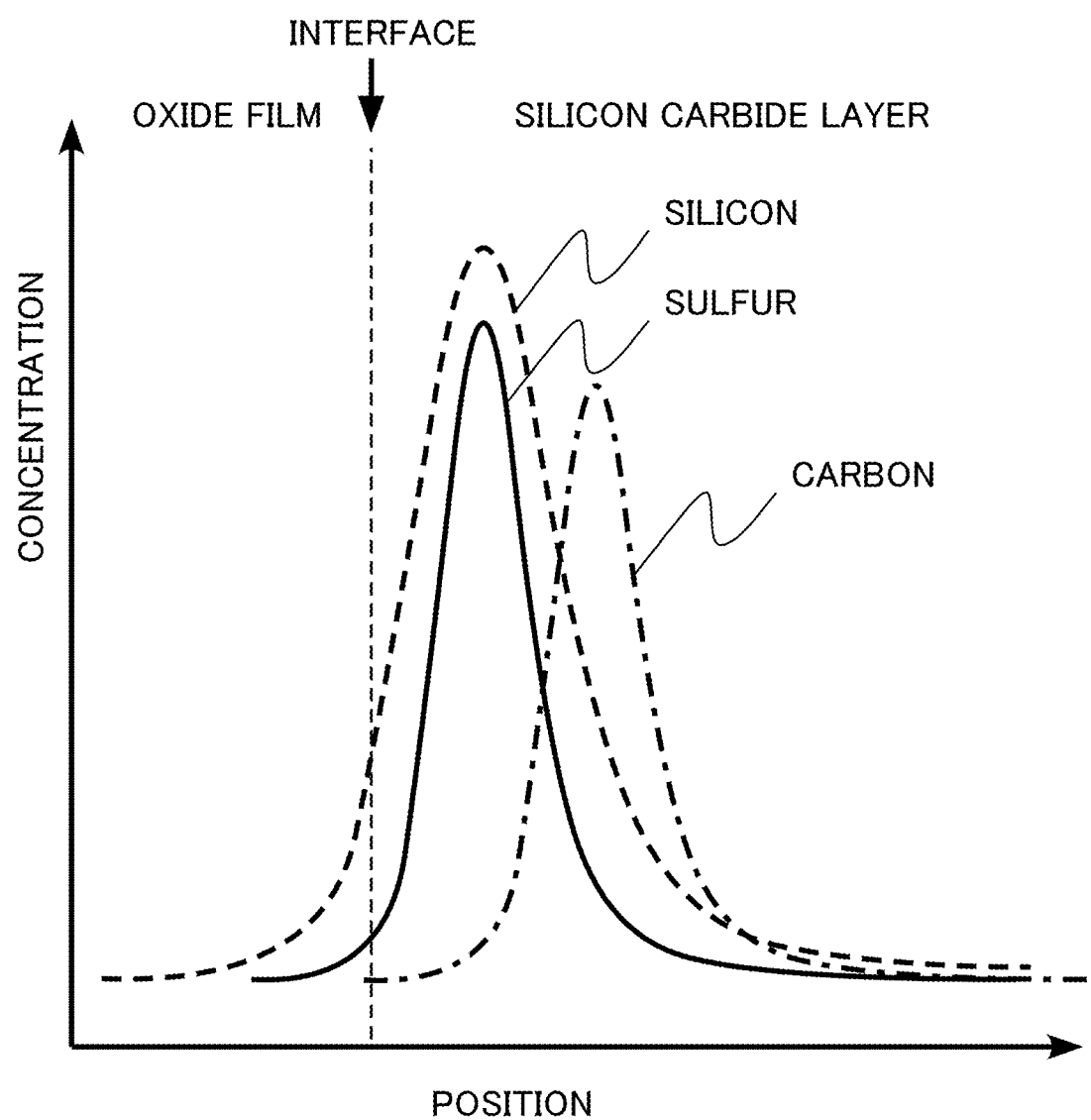
FIG. 10 is an explanatory diagram of the method for manufacturing the semiconductor device of the first embodiment.

FIG. 10 is a diagram illustrating concentration profiles of sulfur (S), silicon (Si), and carbon (C) immediately after the first ion implantation, the second ion implantation, and the third ion implantation are performed. The horizontal axis indicates the position of the silicon carbide layer 10 in the depth direction. The vertical axis indicates the concentration of each element.

The concentration distribution of silicon (Si) includes, for example, the concentration distribution of sulfur (S). For example, the concentration of silicon at any position in the depth direction is higher than the concentration of sulfur.

The position of the maximum concentration in the concentration distribution of carbon is deeper than the position of the maximum concentration in the concentration distribution of sulfur, for example. The position of a peak in the concentration distribution of carbon is deeper than the position of a peak in the concentration distribution of sulfur, for example. A projected range of the third ion implantation of implanting carbon is larger than a projected range of the first ion implantation of implanting sulfur, for example.

Figure 11:
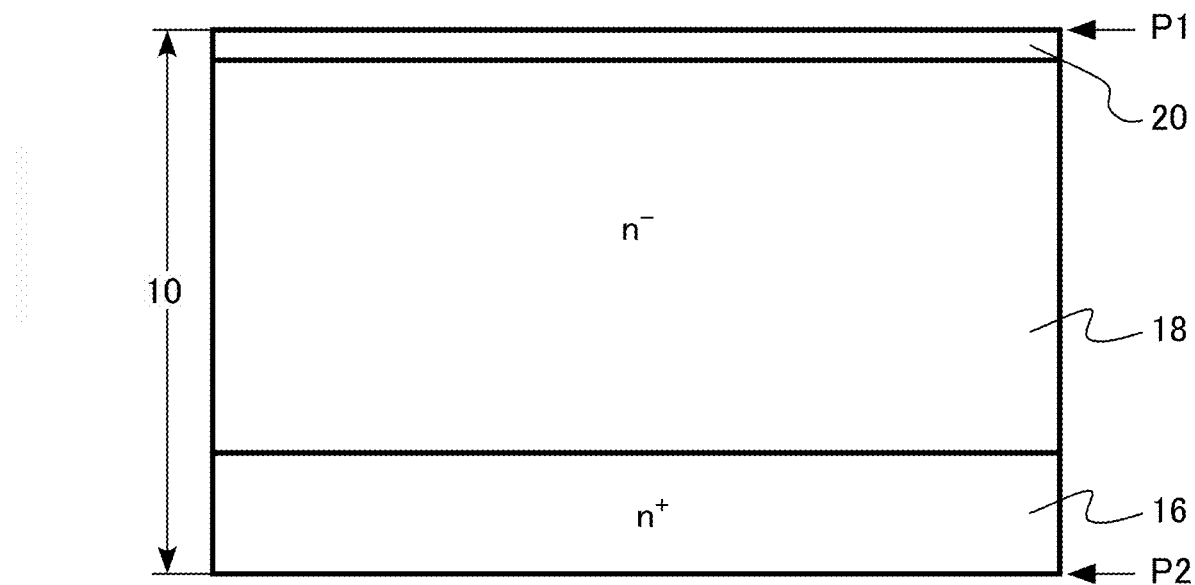
FIG. 11 is an explanatory diagram of the method for manufacturing the semiconductor device of the first embodiment.

In step S105, the oxide film 22 is removed (FIG. 11). The oxide film 22 is removed by, for example, wet etching.

Figure 12:
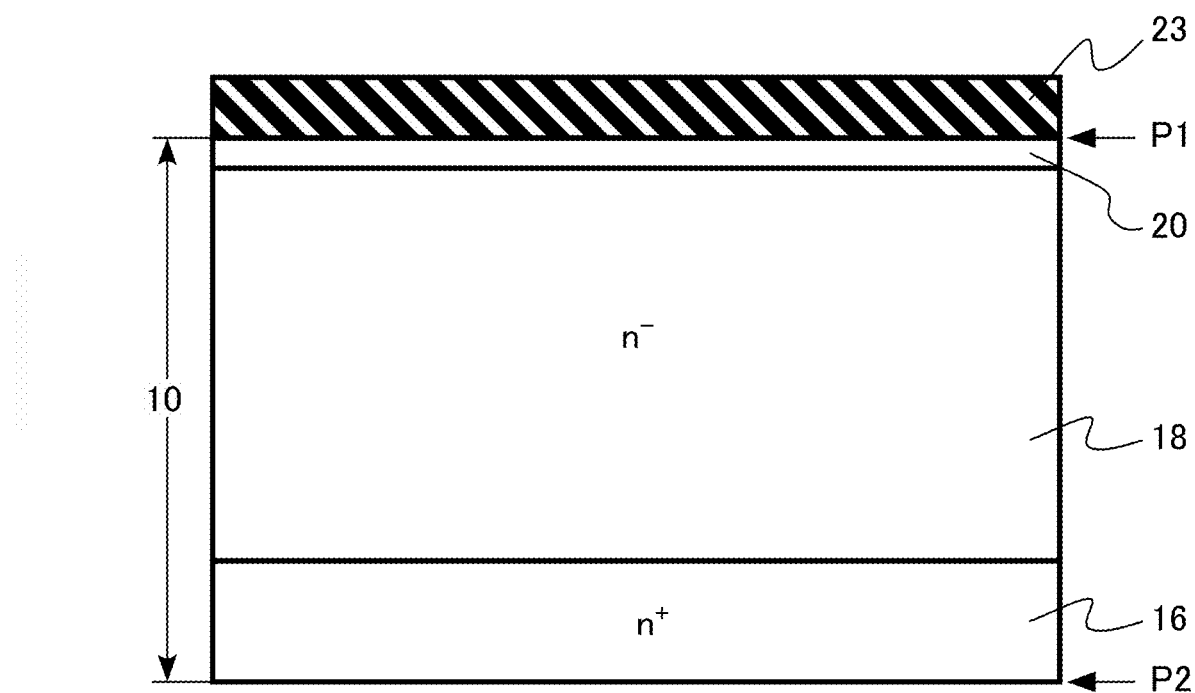
FIG. 12 is an explanatory diagram of the method for manufacturing the semiconductor device of the first embodiment.

In step S106, a carbon film 23 is formed on the silicon carbide layer 10 (FIG. 12). The carbon film 23 is formed, for example, by carbonizing a resist formed by a coating method by heat. Alternatively, the carbon film 23 is formed by, for example, a sputtering method. The carbon film 23 has a function of absorbing surplus silicon and carbon in the silicon carbide layer 10 during high-temperature annealing to be performed later.

In step S107, high-temperature annealing is performed. High-temperature annealing is an example of the second heat treatment. By high-temperature annealing, a sulfur atom enters a carbon vacancy to form a structure in which a carbon atom in the crystal structure of silicon carbide is replaced with one sulfur atom.

High-temperature annealing is performed in an atmosphere containing, for example, argon (Ar) or nitrogen (N). High-temperature annealing is performed in an atmosphere of an inert gas such as an argon (Ar) gas.

The temperature of high-temperature annealing is higher than the temperature of pile-up annealing to be performed later, for example. The temperature of high-temperature annealing is, for example, 700° C. or higher and 1800° C. or lower.

Figure 13:
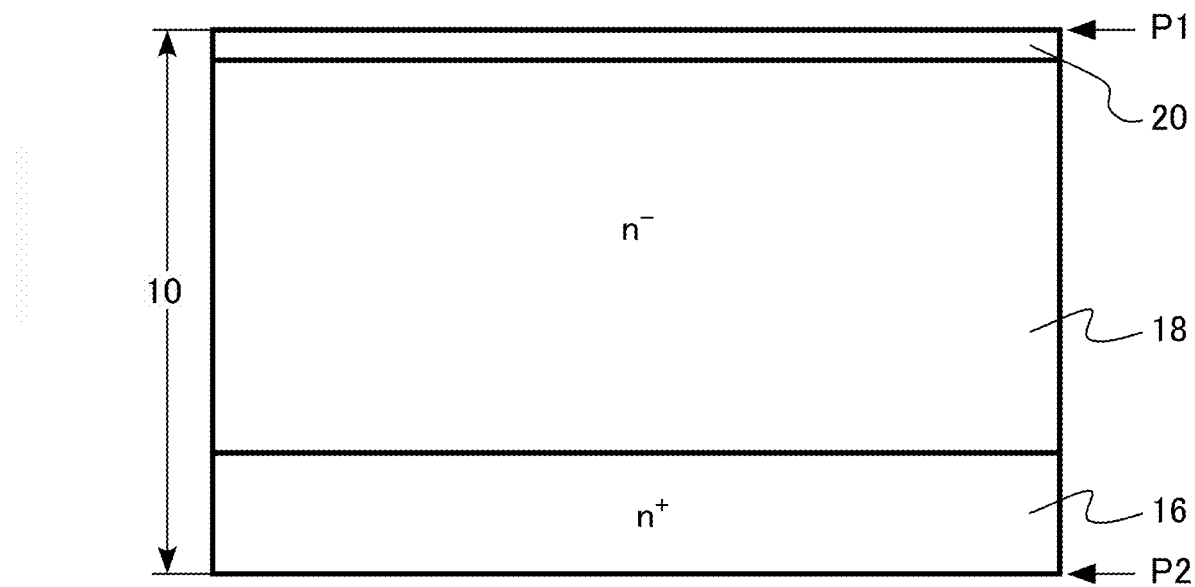
FIG. 13 is an explanatory diagram of the method for manufacturing the semiconductor device of the first embodiment.

In step S108, the carbon film 23 is removed (FIG. 13). The carbon film 23 is removed by, for example, wet etching.

Figure 14:
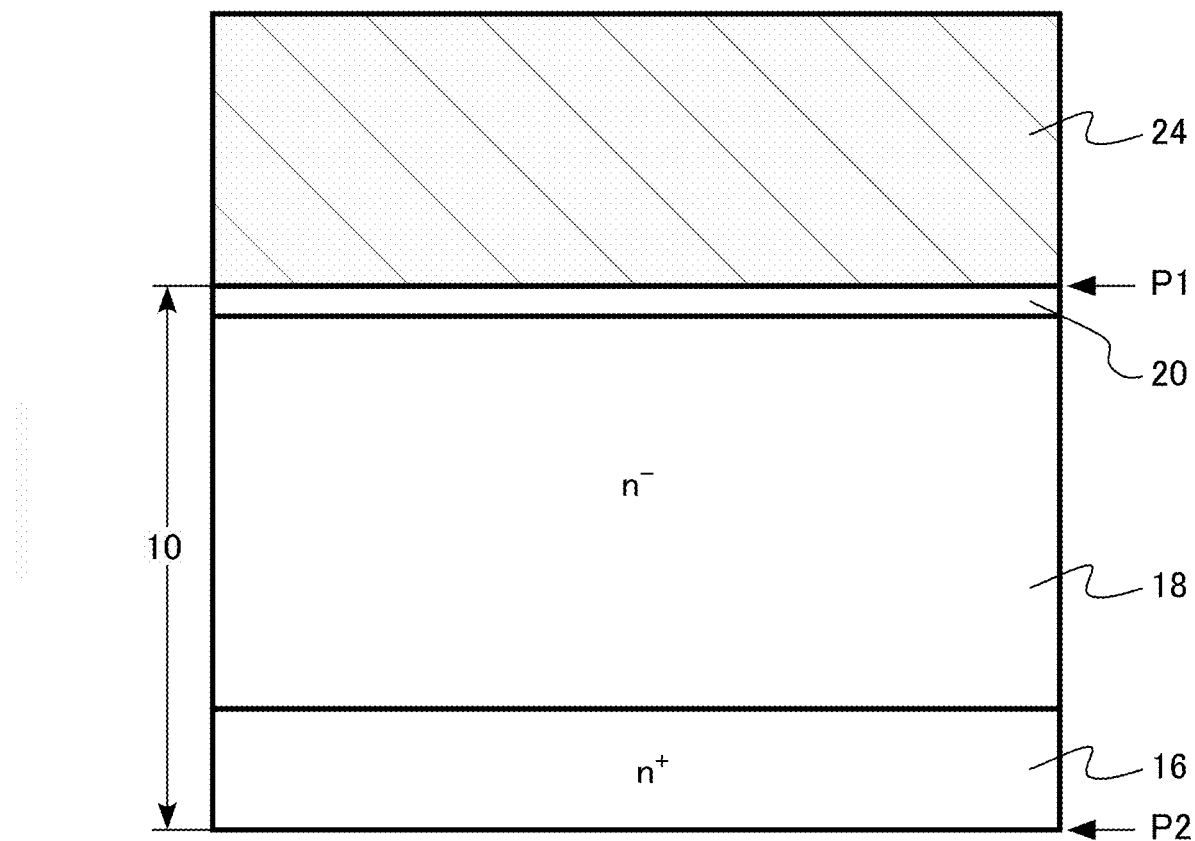
FIG. 14 is an explanatory diagram of the method for manufacturing the semiconductor device of the first embodiment.

In step S109, a stacked film 24 of a titanium film and an aluminum film is formed on the silicon carbide layer 10 (FIG. 14). The stacked film 24 is formed by, for example, a sputtering method. The stacked film 24 is an example of the conductive film. The stacked film 24 finally becomes the anode electrode 12.

In step S110, pile-up annealing is performed. Pile-up annealing is an example of the first heat treatment. By pile-up annealing, sulfur in the sulfur region 20 is piled up at an interface between the anode electrode 12 and the sulfur region 20.

Pile-up annealing is performed in an atmosphere containing argon (Ar) or nitrogen (N), for example. Pile-up annealing is performed in an atmosphere of an inert gas such as an argon (Ar) gas.

The temperature of pile-up annealing is lower than the temperature of high-temperature annealing, for example. The temperature of pile-up annealing is, for example, 300° C. or higher and 700° C. or lower.

In step S111, a nickel film is formed on the second plane P2 of the silicon carbide layer 10. A nickel film is formed on a back surface of the silicon carbide layer 10. The nickel film is formed, for example, by a sputtering method. The nickel film finally becomes the cathode electrode 14.

The SBD 100 illustrated in FIG. 1 is manufactured by the above manufacturing method.

Next, functions and effects of the semiconductor device of the first embodiment and the method for manufacturing the semiconductor device will be described.

In a Schottky barrier diode (SBD) using silicon carbide, a Schottky barrier height between a silicon carbide layer and an electrode may vary. When the Schottky barrier height between the silicon carbide layer and the electrode varies, rectification characteristics of the SBD vary.

For example, when a portion where the Schottky barrier is low is locally generated, on-voltage ($V_F$) may vary during forward bias of the SBD. In addition, when a portion where the Schottky barrier is low is locally generated, for example, an excessive forward current (on-current) may flow in the portion where the Schottky barrier is low, and the SBD 100 may be destroyed. In addition, when a portion where the Schottky barrier is low is locally generated, a breakdown voltage during reverse bias may be locally reduced. Therefore, it is desired to achieve an SBD in which variation in Schottky barrier height is suppressed.

The variation in Schottky barrier height is caused by, for example, variation in reaction between the silicon carbide layer and an electrode, variation in carbon vacancy density in the silicon carbide layer, or variation in n-type impurity concentration.

The SBD 100 includes the sulfur region 20 in contact with the anode electrode 12 in the silicon carbide layer 10. The sulfur region 20 contains one sulfur atom bonded to four silicon atoms. By inclusion of the sulfur region 20 in the SBD 100, variation in Schottky barrier height can be suppressed. This will be described in detail below.

As a result of first principle calculation by the inventor, when interstitial silicon, carbon vacancy, and a sulfur atom coexist in the crystal structure of silicon carbide, it has been clarified that a structure in which one sulfur atom fills the carbon vacancy to be bonded to four silicon atoms is energetically stable, and is preferentially formed as illustrated in FIG. 2B. That is, it has been clarified that a structure in which one sulfur atom is positioned at a carbon site of the crystal structure of silicon carbide is energetically stable.

If the carbon vacancy exists in the crystal structure of silicon carbide, a sulfur atom easily enter a carbon position by diffusion. Meanwhile, when there is no interstitial silicon, a structure in which one sulfur atom is present at a silicon site is the most stable, and a sulfur atom easily enters the silicon site during high-temperature annealing.

In the method for manufacturing the semiconductor device of the first embodiment, by introducing silicon into the silicon carbide layer 10 by the second ion implantation, entry of a sulfur atom into a silicon site in the crystal structure of silicon carbide is suppressed, and entry of a sulfur atom into a carbon site in the crystal structure of silicon carbide is promoted during high-temperature annealing.

When sulfur is introduced into a carbon site, a high temperature heat treatment is desired in order to activate diffusion of sulfur. Meanwhile, the higher the heat treatment is, the easier it is for sulfur to enter a silicon site.

Therefore, in the method for manufacturing the semiconductor device of the first embodiment, by introducing silicon into the silicon carbide layer 10 by the second ion implantation, entry of a sulfur atom into a silicon site can be made difficult during high-temperature annealing. In this way, the process of introducing a sulfur atom into a carbon site is efficiently performed.

Figure 15:
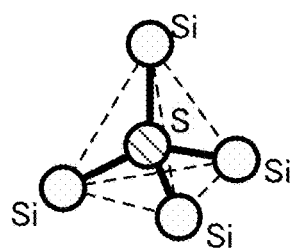
FIG. 15 is an explanatory diagram for functions and effects of the semiconductor device of the first embodiment.
Figure 15:
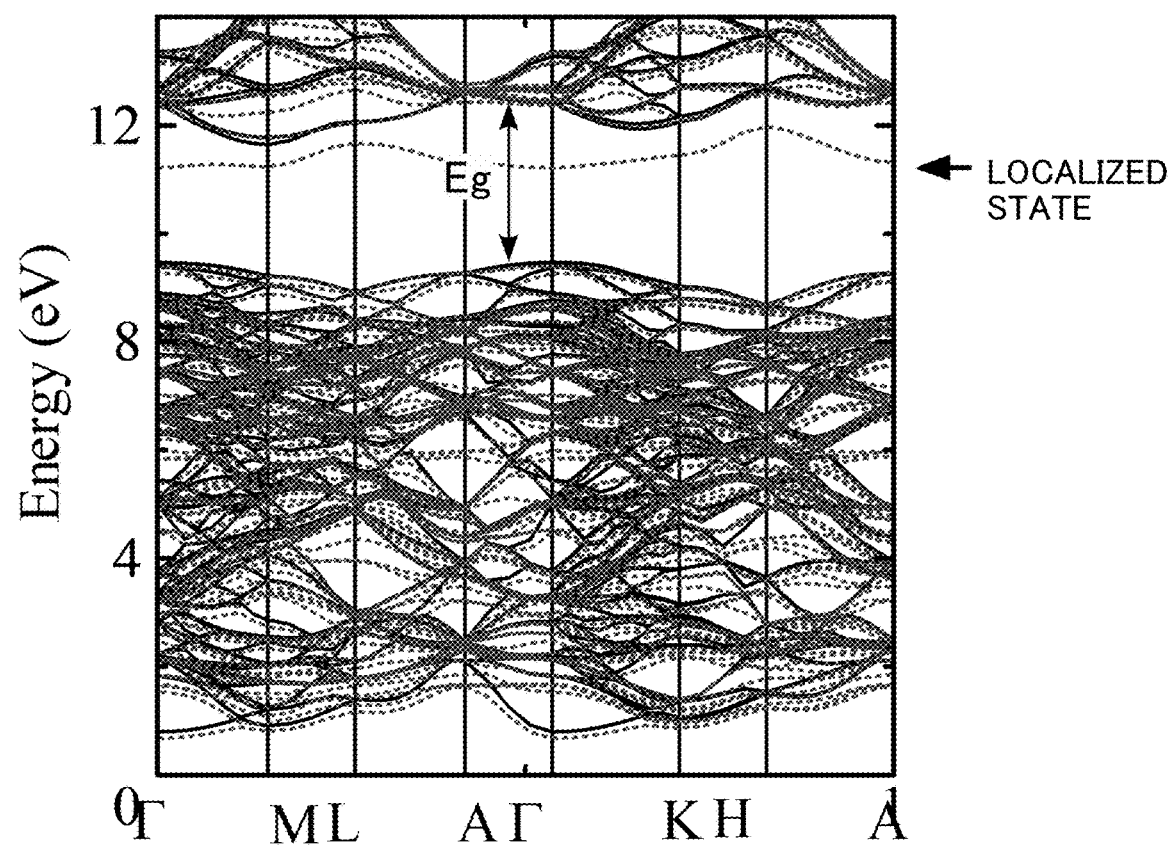

FIG. 15 is an explanatory diagram for functions and effects of the semiconductor device of the first embodiment. FIG. 15 is a band diagram in which one sulfur atom is positioned at a carbon site of the crystal structure of silicon carbide. As illustrated in FIG. 15, a localized state is formed on a lower end side of a conduction band in a band gap (Eg in FIG. 15).

Figure 16:
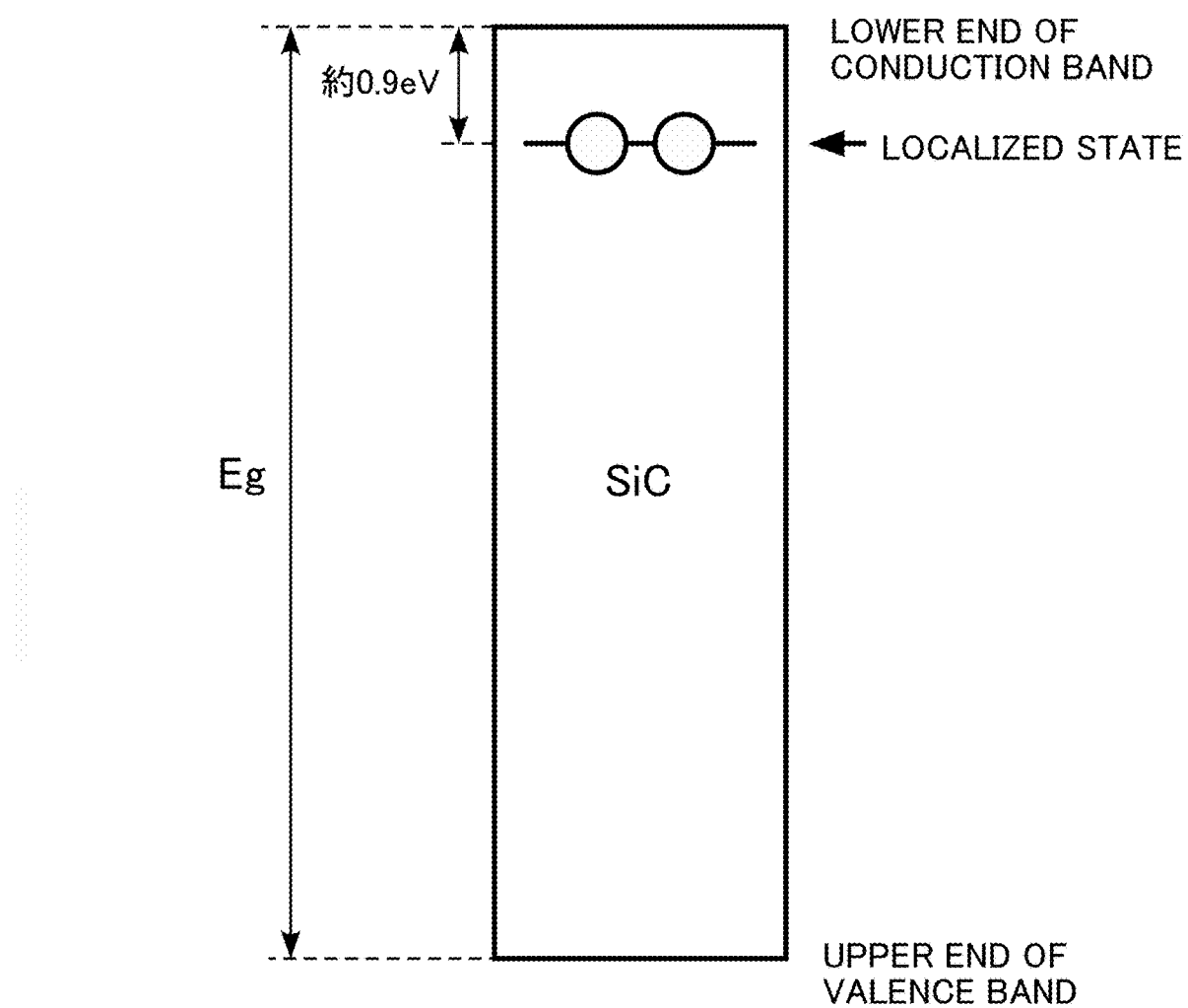
FIG. 16 is an explanatory diagram for functions and effects of the semiconductor device of the first embodiment.

FIG. 16 is an explanatory diagram for functions and effects of the semiconductor device of the first embodiment. FIG. 16 is an explanatory diagram of a localized state formed in the band gap.

As illustrated in FIG. 16, the localized state is formed at a position of about 0.9 eV from a lower end of the conduction band. An energy difference between the localized state and the lower end of the conduction band is, for example, 0.8 eV or more and 1.0 eV or less.

When there is the localized state in the sulfur region 20, electrons move between the anode electrode 12 in contact with the sulfur region 20 and the localized state. This movement of electrons fixes a Schottky barrier height between the anode electrode 12 and the sulfur region 20 at about 0.9 eV. By occurrence of so-called Fermi level pinning, the Schottky barrier height between the anode electrode 12 and the sulfur region 20 is fixed at about 0.9 eV.

By fixing the Schottky barrier height to about 0.9 eV, variation in the Schottky barrier height of the SBD 100 is suppressed.

In addition, by formation of the localized state in the bandgap and occurrence of Fermi level pinning, the Schottky barrier height is fixed at about 0.9 eV regardless of a material of the anode electrode 12. Therefore, a material of the anode electrode 12 can be arbitrarily selected.

A maximum concentration of sulfur in the sulfur region 20 is preferably $1 \times 10^{17}$ cm$^{-3}$ or more, more preferably $1 \times 10^{18}$ cm$^{-3}$ or more, and still more preferably $1 \times 10^{19}$ cm$^{-3}$ or more from a viewpoint of forming a sufficient amount of localized state in the sulfur region 20 and stably fixing the Schottky barrier height.

Meanwhile, a maximum concentration of sulfur in the sulfur region 20 is preferably $1 \times 10^{22}$ cm$^{-3}$ or less, more preferably $1 \times 10^{21}$ cm$^{-3}$ or less, and still more preferably $1 \times 10^{20}$ cm$^{-3}$ or less from a viewpoint of easier formation of the sulfur region 20.

The concentration distribution of sulfur in the anode electrode 12 and the sulfur region 20 has a first peak. The sulfur concentration at the first peak is preferably $1 \times 10^{17}$ cm$^{-3}$ or more, more preferably $1 \times 10^{18}$ cm$^{-3}$ or more, and still more preferably $1 \times 10^{19}$ cm$^{-3}$ or more.

A distance between an interface between the anode electrode 12 and the sulfur region 20 and the first peak is preferably 50 nm or less, more preferably 20 nm or less, still more preferably 5 nm or less, and most preferably 1 nm or less from a viewpoint of facilitating movement of electrons between the localized state and the anode electrode 12.

Among sulfur atoms contained in the sulfur region 20, the ratio of sulfur atoms each bonded to four silicon atoms is preferably higher than the ratio of sulfur atoms having other bonding states from a viewpoint of forming a sufficient amount of localized state in the sulfur region 20 and stably fixing the Schottky barrier height. Examples of the other bonding states include a state in which one sulfur atom is bonded to four carbon atoms. Examples of the other bonding states further include a state in which a sulfur atom is present between lattices of the crystal structure of silicon carbide.

For example, among sulfur atoms contained in the sulfur region 20, the ratio of sulfur atoms each bonded to four silicon atoms is preferably higher than the ratio of sulfur atoms each bonded to four carbon atoms from a viewpoint of forming a sufficient amount of localized state in the sulfur region 20 and stably fixing the Schottky barrier height. In addition, for example, among sulfur atoms contained in the sulfur region 20, the ratio of sulfur atoms each bonded to four silicon atoms is preferably higher than the ratio of sulfur atoms present between lattices of the crystal structure of silicon carbide.

In the method for manufacturing the SBD 100 of the first embodiment, sulfur is introduced into the silicon carbide layer 10 by the first ion implantation. In addition, silicon is introduced into the silicon carbide layer 10 by the second ion implantation. By energy of the first ion implantation and energy of the second ion implantation, a carbon bond in the silicon carbide layer 10 is broken, and a large amount of carbon vacancy can be formed.

By filling a large amount of carbon vacancy thus formed with sulfur atoms, it is possible to form a large amount of localized state in the sulfur region 20.

In addition, by introducing silicon into the silicon carbide layer 10 by the second ion implantation, entry of a sulfur atom into a silicon site in the crystal structure of silicon carbide is suppressed during high-temperature annealing, and entry of a sulfur atom into a carbon site in the crystal structure of silicon carbide is promoted.

As illustrated in FIG. 10, the concentration distribution of silicon (Si) immediately after the first ion implantation and the second ion implantation preferably includes the concentration distribution of sulfur (S) from a viewpoint of promoting entry of a sulfur atom into a carbon site of the crystal structure of silicon carbide.

In addition, in the method for manufacturing the SBD 100 of the first embodiment, carbon is introduced into the silicon carbide layer 10 by the third ion implantation.

Sulfur atoms diffuse through carbon vacancy. Carbon introduced into the silicon carbide layer 10 fills the carbon vacancy during high-temperature annealing. Therefore, diffusion of sulfur atoms into a deep position of the silicon carbide layer 10 is suppressed.

As illustrated in FIG. 10, the position of a maximum concentration of the concentration distribution of carbon immediately after the first ion implantation and the third ion implantation is preferably deeper than the position of a maximum concentration of the concentration distribution of sulfur from a viewpoint of suppressing diffusion of sulfur atoms into a deep position of the silicon carbide layer 10.

Figure 17:
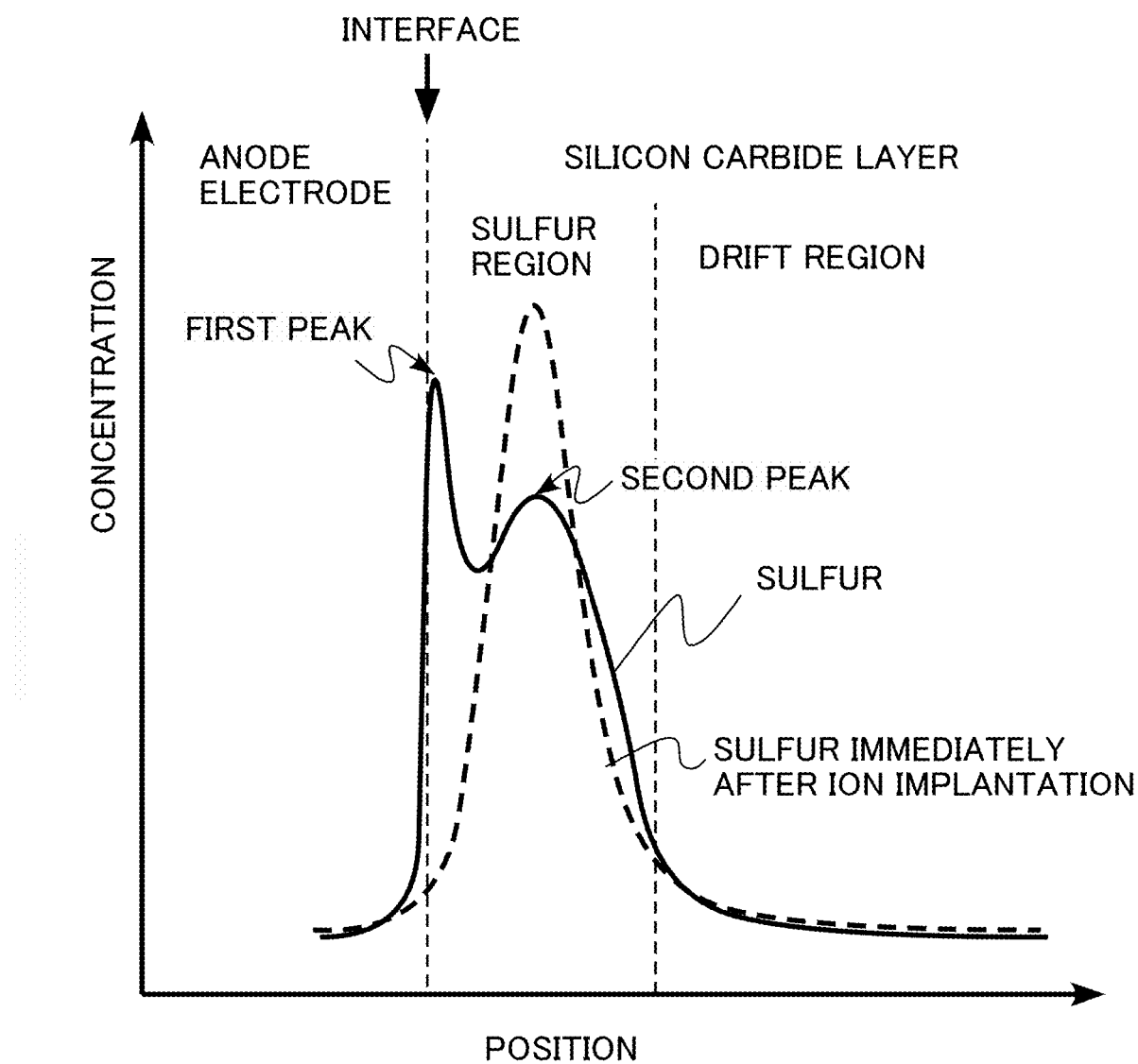
FIG. 17 is an explanatory diagram for functions and effects of the method for manufacturing the semiconductor device of the first embodiment.

FIG. 17 is an explanatory diagram for functions and effects of the method for manufacturing the semiconductor device of the first embodiment. FIG. 17 is a diagram illustrating a concentration distribution of sulfur in the method for manufacturing the semiconductor device of the first embodiment. FIG. 17 illustrates a concentration distribution of sulfur in the anode electrode 12 and the silicon carbide layer 10 in the depth direction. FIG. 17 illustrates a concentration distribution of sulfur in the anode electrode 12, the sulfur region 20, and the drift region 18 in the depth direction.

In FIG. 17, the broken line curve indicates the concentration distribution of sulfur immediately after ion implantation of sulfur. In FIG. 17, the solid line curve indicates the concentration distribution of sulfur after pile-up annealing.

Immediately after ion implantation, a peak in the concentration distribution of sulfur is formed at a depth position determined by accelerating voltage of the ion implantation. Then, by performing high-temperature annealing before forming the anode electrode 12, sulfur diffuses toward a front surface side and a back surface side of the silicon carbide layer 10.

Then, by performing pile-up annealing after forming the anode electrode 12, sulfur is piled up at an interface between the anode electrode 12 and the sulfur region 20. This is because the structure in which carbon vacancy is filled with one sulfur atom becomes energetically more stable due to approach to the anode electrode 12. The structure in which carbon vacancy is filled with one sulfur atom becomes energetically more stable because movement of electrons between the anode electrode 12 and the localized state becomes easy due to approach to the anode electrode 12.

By inclusion of the sulfur region 20 in the SBD 100 of the first embodiment, variation in Schottky barrier height is suppressed. Therefore, the SBD 100 with stable rectification characteristics can be achieved.

By inclusion of the sulfur region 20 in the SBD 100 of the first embodiment, the Schottky barrier height is fixed at about 0.9 eV. Therefore, a material of the anode electrode 12 can be arbitrarily selected. Therefore, the degree of freedom in the structural design and manufacturing process of the SBD 100 is increased.

Note that up to this point, the case where the element contained in the second silicon carbide region is sulfur (S) has been exemplified, but even when the element contained in the second silicon carbide region is an element other than sulfur (S), that is, selenium (Se), tellurium (Te), titanium (Ti), zirconium (Zr), hafnium (Hf), vanadium (V), niobium (Nb), tantalum (Ta), chromium (Cr), molybdenum (Mo), or tungsten (W), similar functions and effects to those in the case of sulfur can be obtained.

An element other than sulfur (S) also behaves in a similar manner to sulfur (S) in the crystal structure of silicon carbide. An atom of an element selected from the group consisting of sulfur, selenium, tellurium, titanium, zirconium, hafnium, vanadium, niobium, tantalum, chromium, molybdenum, and tungsten is represented by A. When interstitial silicon, carbon vacancy, and an atom A coexist in the crystal structure of silicon carbide, as in the case illustrated in FIG. 2B, a structure in which one atom A fills the carbon vacancy to be bonded to four silicon atoms is energetically stable, and is preferentially formed. That is, a structure in which one atom A is positioned at a carbon site of the crystal structure of silicon carbide is energetically stable.

When one atom A of any one of the above elements is bonded to four silicon atoms, the Schottky barrier height is fixed at a level of 0.8 eV or more and 1.3 eV or less.

Table 1 illustrates the Schottky barrier heights of the above elements. As illustrated in Table 1, the Schottky barrier heights are 0.8 eV or more and 1.3 eV or less. Specifically, the Schottky barrier heights for selenium, tellurium, titanium, zirconium, and hafnium are 0.9 eV or more and 1.1 eV or less. For example, the Schottky barrier height is about 1.0 eV. The Schottky barrier height for vanadium is 1.0 eV or more and 1.2 eV or less. For example, the Schottky barrier height is about 1.1 eV. The Schottky barrier heights for niobium, tantalum, chromium, molybdenum, and tungsten are 1.1 eV or more and 1.3 eV or less. For example, the Schottky barrier height is about 1.2 eV.

TABLE 1

| Element | Schottky barrier height (eV) |
| --- | --- |
| Sulfur (S) | 0.8–1.0 |
| Selenium (Se) | 0.9–1.1 |
| Tellurium (Te) | 0.9–1.1 |
| Titanium (Ti) | 0.9–1.1 |
| Zirconium (Zr) | 0.9–1.1 |
| Hafnium (Hf) | 0.9–1.1 |
| Vanadium (V) | 1.0–1.2 |
| Niobium (Nb) | 1.1–1.3 |

TABLE 1-continued

| Element | Schottky barrier height (eV) |
|---|---|
| Tantalum (Ta) | 1.1-1.3 |
| Chromium (Cr) | 1.1-1.3 |
| Molybdenum (Mo) | 1.1-1.3 |
| Tungsten (W) | 1.1-1.3 |

Even the atom A of an element selected from the group consisting of selenium, tellurium, titanium, zirconium, hafnium, vanadium, niobium, tantalum, chromium, molybdenum, and tungsten diffuses through carbon vacancy like sulfur. Carbon introduced by the third ion implantation fills carbon vacancy, and therefore diffusion of the atom A can be suppressed.

As described above, according to the first embodiment, it is possible to achieve a semiconductor device that suppresses variation in Schottky barrier height.

Second Embodiment

A semiconductor device of a second embodiment is different from the semiconductor device of the first embodiment in that a silicon carbide layer further includes a pair of third silicon carbide regions of p-type interposing a second silicon carbide region and in contact with the first electrode. Hereinafter, descriptions overlapping with the first embodiment will be partially omitted.

Figure 18:
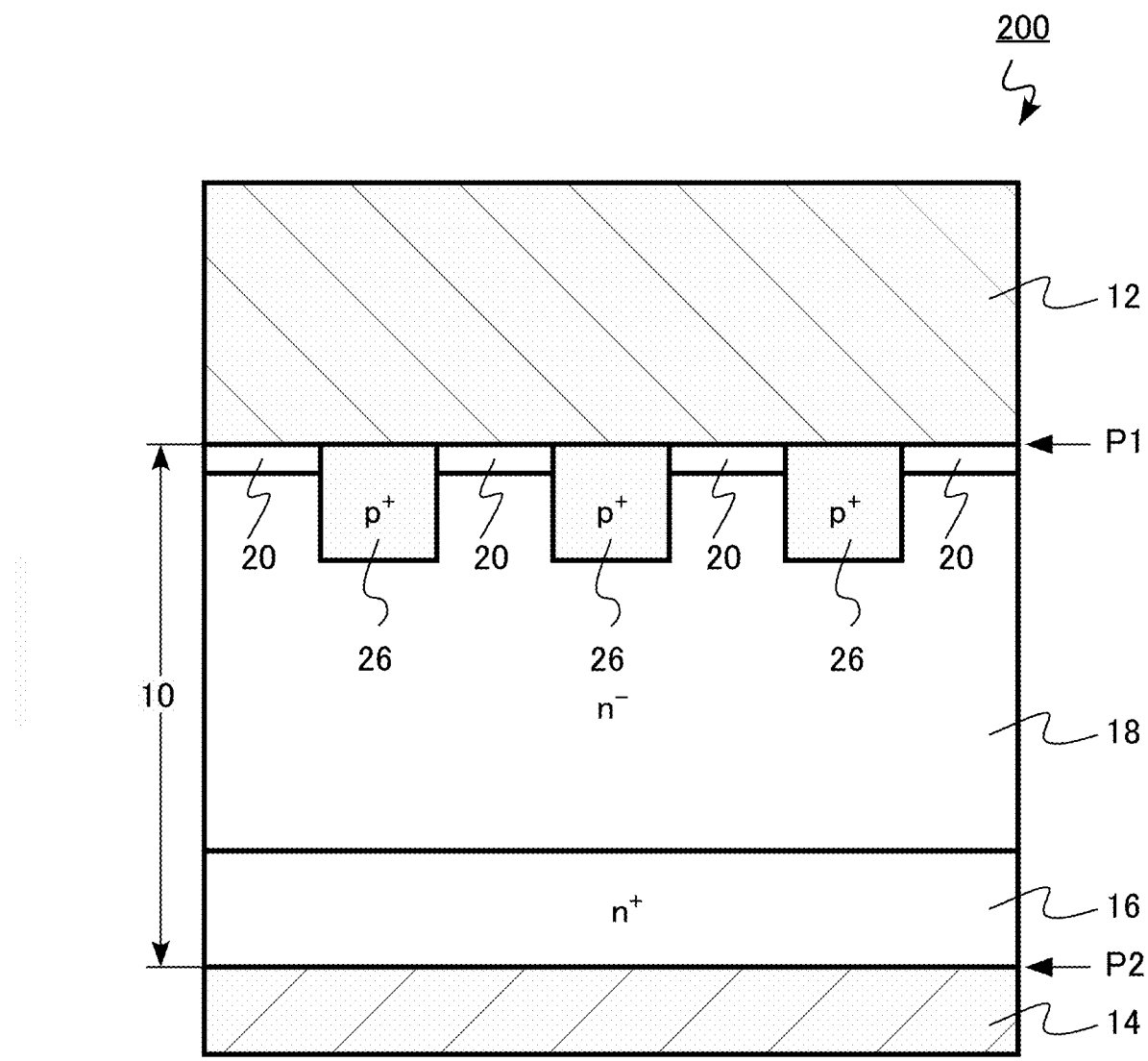
FIG. 18 is a schematic cross sectional view of a semiconductor device of a second embodiment.

FIG. 18 is a schematic cross-sectional view of the semiconductor device of the second embodiment. The semiconductor device of the second embodiment is a junction barrier Schottky (JBS) diode. The semiconductor device of the second embodiment is a JBS diode 200. The JBS diode 200 uses electrons as carriers.

The JBS diode 200 includes a silicon carbide layer 10, an anode electrode 12 (first electrode), and a cathode electrode 14 (second electrode).

The anode electrode 12 is an example of the first electrode. The cathode electrode 14 is an example of the second electrode.

The silicon carbide layer 10 includes a cathode region 16, a drift region 18 (first silicon carbide region), a sulfur region 20 (second silicon carbide region), and a plurality of p-type regions 26 (third silicon carbide regions).

The p-type regions 26 are disposed between the drift region 18 and the anode electrode 12. The p-type regions 26 are disposed between the drift region 18 and a first plane P1. The p-type regions 26 are in contact with the anode electrode 12.

A pair of the p-type regions 26 interpose the sulfur region 20. The depth of each of the p-type regions 26 is, for example, deeper than the depth of the sulfur region 20. The pair of p-type regions 26 interpose the drift region 18.

The p-type regions 26 contain p-type impurities. The p-type regions 26 contain, for example, aluminum (Al) or boron (B) as p-type impurities. The p-type impurity concentration in the p-type regions 26 is, for example, $1 \times 10^{18}$ cm$^{-3}$ or more and $1 \times 10^{21}$ cm$^{-3}$ or less.

In the JBS diode 200, depletion layers expands from the p-type regions 26 covers the drift region 18 between the p-type regions 26 during reverse bias. Therefore, a leakage current during reverse bias is suppressed.

As described above, according to the second embodiment, as in the first embodiment, it is possible to achieve a semiconductor device that suppresses variation in Schottky barrier height. In addition, a semiconductor device that suppresses a leakage current during reverse bias is achieved.

Third Embodiment

A semiconductor device of a third embodiment includes: a first silicon carbide region of n-type; a second silicon carbide region disposed between the first silicon carbide region and the first electrode, the second silicon carbide region being in contact with the first electrode, the second silicon carbide region containing at least one element selected from the group consisting of sulfur (S), selenium (Se), tellurium (Te), titanium (Ti), zirconium (Zr), hafnium (Hf), vanadium (V), niobium (Nb), tantalum (Ta), chromium (Cr), molybdenum (Mo), and tungsten (W), and the second silicon carbide region containing at least one first atom of the at least one element, the first atom being bonded to four silicon atoms; a third silicon carbide region of p-type disposed between the first silicon carbide region and the first electrode; and a fourth silicon carbide region of n-type disposed between the third silicon carbide region and the first electrode, the fourth silicon carbide region being in contact with the first electrode, and n-type impurity concentration of the fourth silicon carbide region being higher than n-type impurity concentration of the first silicon carbide region; a gate electrode disposed on a side of the first electrode of the silicon carbide layer; and a gate insulating layer disposed between the gate electrode and the third silicon carbide region. Hereinafter, descriptions overlapping with the first embodiment will be partially omitted.

Figure 19:
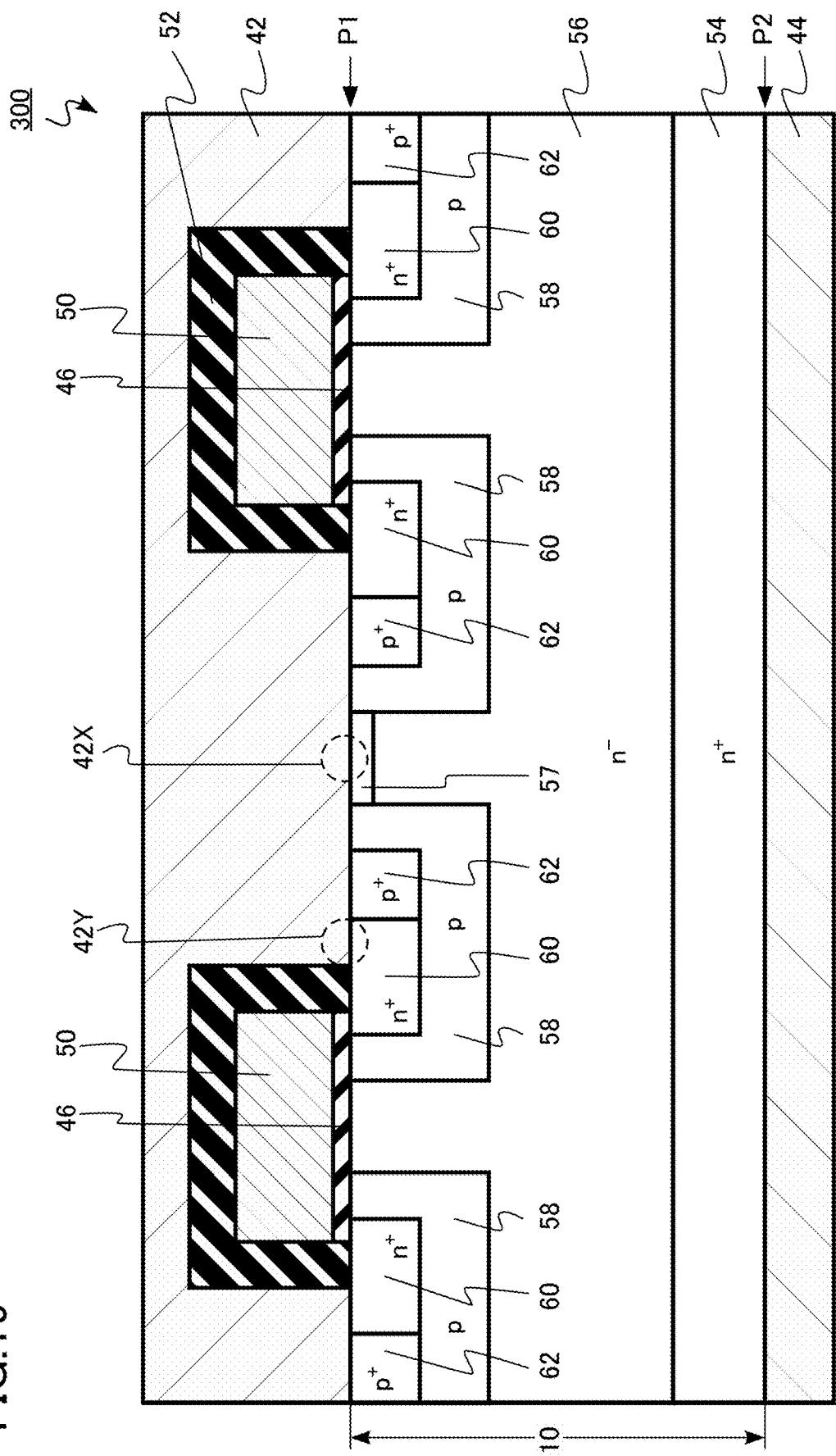
FIG. 19 is a schematic cross sectional view of a semiconductor device of a third embodiment.

FIG. 19 is a schematic cross-sectional view of the semiconductor device of the third embodiment. The semiconductor device of the third embodiment is a planar gate type vertical MOSFET 300. The MOSFET 300 is an re-channel type transistor using electrons as carriers.

The MOSFET 300 includes an SBD as a built-in diode. The SBD, which is a built-in diode, has a similar structure to the SBD 100 of the first embodiment.

The MOSFET 300 includes a silicon carbide layer 10, a source electrode 42 (first electrode), a drain electrode 44 (second electrode), a gate insulating layer 46, a gate electrode 50, and an interlayer insulating layer 52. The source electrode 42 has a first portion 42X and a second portion 42Y.

The source electrode 42 is an example of the first electrode. The drain electrode 44 is an example of the second electrode.

The silicon carbide layer 10 includes a drain region 54, a drift region 56 (first silicon carbide region), a sulfur region 57 (second silicon carbide region), a p-well region 58 (third silicon carbide region), a source region 60 (fourth silicon carbide region), and a p-well contact region 62.

The silicon carbide layer 10 is made of, for example, a single crystal of 4H—SiC. The silicon carbide layer 10 has a first plane P1 and a second plane P2. The second plane P2 faces the first plane P1. The first plane P1 is a front surface of the silicon carbide layer 10, and the second plane P2 is a back surface of the silicon carbide layer 10.

The silicon carbide layer 10 is disposed between the source electrode 42 and the drain electrode 44.

Here, the term "depth" means a distance from the first plane P1 in a direction going from the first plane P1 to the second plane P2.

The drain region 54 is made of SiC of n$^+$ type. The drain region 54 contains, for example, nitrogen (N) as n-type impurities. The n-type impurity concentration in the drain region 54 is, for example, $1 \times 10^{18}$ cm$^{-3}$ or more and $1 \times 10^{21}$ cm$^{-3}$ or less.

The drift region 56 is made of SiC of n$^-$ type. The drift region 56 is disposed between the drain region 54 and the source electrode 42. The drift region 56 is disposed between the drain region 54 and the first plane P1. A part of the drift region 56 is in contact with the first plane P1.

The drift region 56 contains, for example, nitrogen (N) as n-type impurities. The n-type impurity concentration in the drift region 56 is, for example, $1 \times 10^{15}$ cm$^{-3}$ or more and $2 \times 10^{16}$ cm$^{-3}$ or less. The n-type impurity concentration in the drift region 56 is lower than the n-type impurity concentration in the drain region 54.

For example, the drift region 56 is a SiC epitaxial growth layer formed on the drain region 54 by epitaxial growth. The drift region 56 has a thickness, for example, of 5 μm or more and 100 μm or less.

The sulfur region 57 is made of SiC of n$^-$ type. The sulfur region 57 is disposed between the drift region 18 and the source electrode 42. The sulfur region 57 is disposed between the drift region 18 and the first plane P1. The sulfur region 57 is in contact with the source electrode 42.

The sulfur region 57 contains sulfur as impurities. A maximum concentration of sulfur in the sulfur region 57 is, for example, $1 \times 10^{17}$ cm$^{-3}$ or more and $1 \times 10^{22}$ cm$^{-3}$ or less.

The sulfur region 57 contains at least one sulfur atom bonded to four silicon atoms.

The sulfur region 57 contains, for example, nitrogen (N) as n-type impurities. The n-type impurity concentration in the sulfur region 57 is, for example, $1 \times 10^{15}$ cm$^{-3}$ or more and $2 \times 10^{16}$ cm$^{-3}$ or less.

The sulfur region 57 is interposed between a pair of the p-well regions 58.

The p-well region 58 is made of SiC of p-type. The p-well region 58 is disposed between the drift region 56 and the source electrode 42. The p-well region 58 is disposed between the drift region 56 and the first plane P1. A part of the p-well region 58 is in contact with the first plane P1.

The p-well region 58 contains, for example, aluminum (Al) as p-type impurities. The p-type impurity concentration in the p-well region 58 is, for example, $1 \times 10^{16}$ cm$^{-3}$ or more and $1 \times 10^{20}$ cm$^{-3}$ or less.

The p-well region 58 has a depth, for example, of 0.4 μm or more and 0.8 μm or less. The p-well region 58 functions as a channel region of the MOSFET 300.

The source region 60 is made of SiC of n$^+$ type. The source region 60 is disposed between the p-well region 58 and the source electrode 42. The source region 60 is disposed between the p-well region 58 and the first plane P1. A part of the source region 60 is in contact with the first plane P1.

The source region 60 contains phosphorus (P) or nitrogen (N) as an n-type impurity. The n-type impurity concentration in the source region 60 is, for example, $1 \times 10^{18}$ cm$^{-3}$ or more and $1 \times 10^{22}$ cm$^{-3}$ or less. The n-type impurity concentration in the source region 60 is higher than the n-type impurity concentration in the drift region 56.

The depth of the source region 60 is shallower than the depth of the p-well region 58. The depth of the source region 60 is, for example, 0.1 μm or more and 0.4 μm or less.

The p-well contact region 62 is made of SiC of p$^+$ type. The p-well contact region 62 is disposed between the p-well region 58 and the source electrode 42. The p-well contact region 62 is disposed between the p-well region 58 and the first plane P1. The p-well contact region 62 is adjacent to the source region 60.

The p-well contact region 62 contains, for example, aluminum as p-type impurities. The p-type impurity concentration in the p-well contact region 62 is, for example, $1 \times 10^{18}$ cm$^{-3}$ or more and $1 \times 10^{22}$ cm$^{-3}$ or less. The p-type impurity concentration in the p-well contact region 62 is higher than the p-type impurity concentration in the p-well region 58.

The depth of the p-well contact region 62 is shallower than the depth of the p-well region 58. The depth of the p-well contact region 62 is, for example, 0.1 μm or more and 0.4 μm or less.

The gate insulating layer 46 is disposed between the silicon carbide layer 10 and the gate electrode 50. The gate insulating layer 46 is disposed between the p-well region 58 and the gate electrode 50.

The gate insulating layer 46 is made of, for example, an oxide or an oxynitride. The gate insulating layer 46 is made of, for example, silicon oxide. The gate insulating layer 46 has a thickness, for example, of 30 nm or more and 100 nm or less.

The gate insulating layer 46 is in contact with the p-well region 58. The p-well region 58 near the gate insulating layer 46 functions as the channel region of the MOSFET 300.

The gate electrode 50 is disposed on a side of the first plane P1 of the silicon carbide layer 10. The gate electrode 50 is provided on the gate insulating layer 46. The gate insulating layer 46 is interposed between the gate electrode 50 and the drift region 56, the source region 60, and the p-well region 58.

The gate electrode 50 is a conductor. The gate electrode 50 is made of, for example, polycrystalline silicon containing n-type impurities or p-type impurities. The gate electrode 50 may be made of, for example, a metal such as titanium nitride, tungsten nitride, tungsten, aluminum, copper, ruthenium, cobalt, nickel, cobalt silicide, or nickel silicide. The gate electrode 50 may have a stacked structure of any one of the above metals and polycrystalline silicon containing n-type impurities or p-type impurities.

The interlayer insulating layer 52 is formed on the gate electrode 50. The interlayer insulating layer 52 electrically separates the gate electrode 50 from the source electrode 42. The interlayer insulating layer 52 is made of, for example, silicon oxide.

The source electrode 42 is disposed on a side of the first plane P1 of the silicon carbide layer 10. The source electrode 42 is electrically connected to the sulfur region 57, the source region 60, and the p-well contact region 62. The source electrode 42 is in contact with the sulfur region 57, the source region 60, and the p-well contact region 62. The source electrode 42 also functions as a p-well electrode that applies an electric potential to the p-well region 58.

The source electrode 42 is in ohmic-contact with the source region 60. The source electrode 42 is in ohmic-contact with the p-well contact region 62.

The source electrode 42 is in Schottky-contact with the sulfur region 57. A Schottky barrier height between the source electrode 42 and the sulfur region 57 is, for example, 0.8 eV or more and 1.0 eV or less. The Schottky barrier height between the source electrode 42 and the sulfur region 57 is, for example, about 0.9 eV.

The source electrode 42 is made of a conductor. The source electrode 42 is made of, for example, a metal, an intermetallic compound, a metal nitride, a metal silicide, or a semiconductor.

The source electrode 42 may have, for example, a stacked structure. The source electrode 42 has, for example, a stacked structure of two different types of metals. The source electrode 42 has, for example, a stacked structure of a metal silicide and a metal.

The source electrode 42 has, for example, a stacked structure of titanium and aluminum. The source electrode 42 contains, for example, nickel silicide. The source electrode 42 has, for example, a stacked structure of nickel silicide and aluminum.

The source electrode 42 has the first portion 42X and the second portion 42Y. The first portion 42X is in contact with the sulfur region 57. The second portion 42Y is in contact with the source region 60. The first portion 42X and the second portion 42Y are made of, for example, the same material. The first portion 42X and the second portion 42Y have, for example, substantially same chemical composition.

The drain electrode 44 is disposed on a side of the second plane P2 of the silicon carbide layer 10. The drain electrode 44 is in contact with the drain region 54. The drain electrode 44 is electrically connected to the drain region 54.

The drain electrode 44 is made of a conductor. The drain electrode 44 is made of, for example, a metal, an intermetallic compound, a metal nitride, a metal silicide, or a semiconductor.

The drain electrode 44 is made of, for example, nickel. Nickel may react with the silicon carbide layer 10 to form nickel silicide. Nickel silicide is, for example, NiSi or $Ni_2Si$.

Hereinafter, functions and effects of the semiconductor device of the third embodiment will be described.

Figure 20:
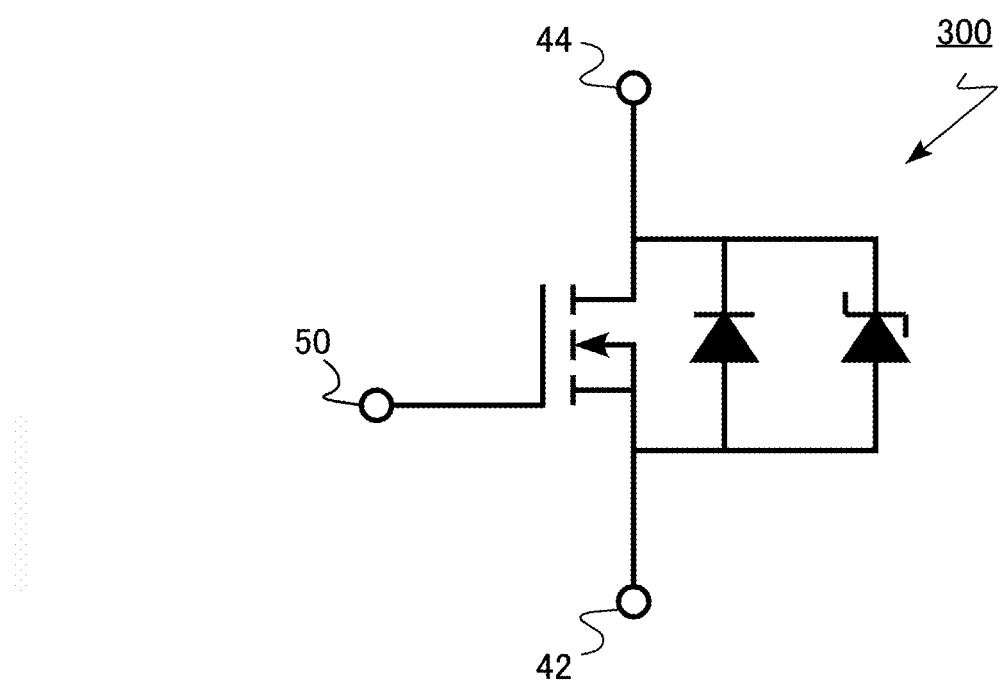
FIG. 20 is an equivalent circuit diagram of the semiconductor device of the third embodiment.

FIG. 20 is an equivalent circuit diagram of the semiconductor device of the third embodiment. A pn diode and an SBD are connected as built-in diodes in parallel to a transistor having the gate electrode 50 between the source electrode 42 and the drain electrode 44. The source electrode 42 is an anode of the pn junction diode, and the drain electrode 44 is a cathode of the pn junction diode. The source electrode 42 is an anode of the SBD, and the drain electrode 44 is a cathode of the SBD.

The source electrode 42, the sulfur region 57, the drift region 56, the drain region 54, and the drain electrode 44 constitute the SBD.

For example, a case where the MOSFET 300 is used as a switching element connected to an inductive load will be considered. When the MOSFET 300 is off, a voltage at which the source electrode 42 is positive with respect to the drain electrode 44 may be applied due to a load current caused by the inductive load. In this case, a forward current flows in the built-in diode. This state is also called a reverse conduction state.

A forward voltage (Vf) at which the forward current begins to flow in the SBD is lower than a forward voltage (Vf) of the pn junction diode. Therefore, first, the forward current flows in the SBD.

The forward voltage (Vf) of the SBD is, for example, 0.9 V. The forward voltage (Vf) of the pn junction diode is, for example, 2.5 V.

The SBD performs a unipolar operation. Therefore, even when the forward current flows, stacking defects do not grow in the silicon carbide layer 10 due to recombination energy of carriers. Therefore, on-resistance does not fluctuate due to growth of the stacking defects.

The SBD of the MOSFET 300 includes the sulfur region 57. Therefore, as in the SBD 100 of the first embodiment, variation in the Schottky barrier height is suppressed. Therefore, the SBD with stable rectification characteristics is achieved.

In the MOSFET 300, in order to reduce on-resistance, the second portion 42Y of the source electrode 42 is preferably in ohmic-contact with the source region 60, and the contact resistance is preferably low. Meanwhile, in order to achieve the rectifying function of the SBD, the first portion 42X of the source electrode 42 needs to be in Schottky-contact with the sulfur region 57.

By inclusion of the sulfur region 57 in the MOSFET 300, the first portion 42X is in Schottky-contact with the sulfur region 57 regardless of a material of the first portion 42X. Therefore, an optimum material of the source electrode 42 can be selected such that the second portion 42Y is in ohmic-contact with the source region 60, and the contact resistance is low.

That is, the first portion 42X and the second portion 42Y can be made of the same material. Therefore, it is not necessary to adopt a complex device structure such as a structure in which different materials are applied to the first portion 42X and the second portion 42Y. In addition, since the first portion 42X and the second portion 42Y can be made of the same material, a manufacturing process is also simplified. Therefore, it is possible to achieve a MOSFET having a simple device structure, manufactured by a simple manufacturing process, and including an SBD.

(First Modification)

A semiconductor device of a first modification of the third embodiment is different from the semiconductor device of the third embodiment in that a silicon carbide layer includes a current diffusion region.

Figure 21:
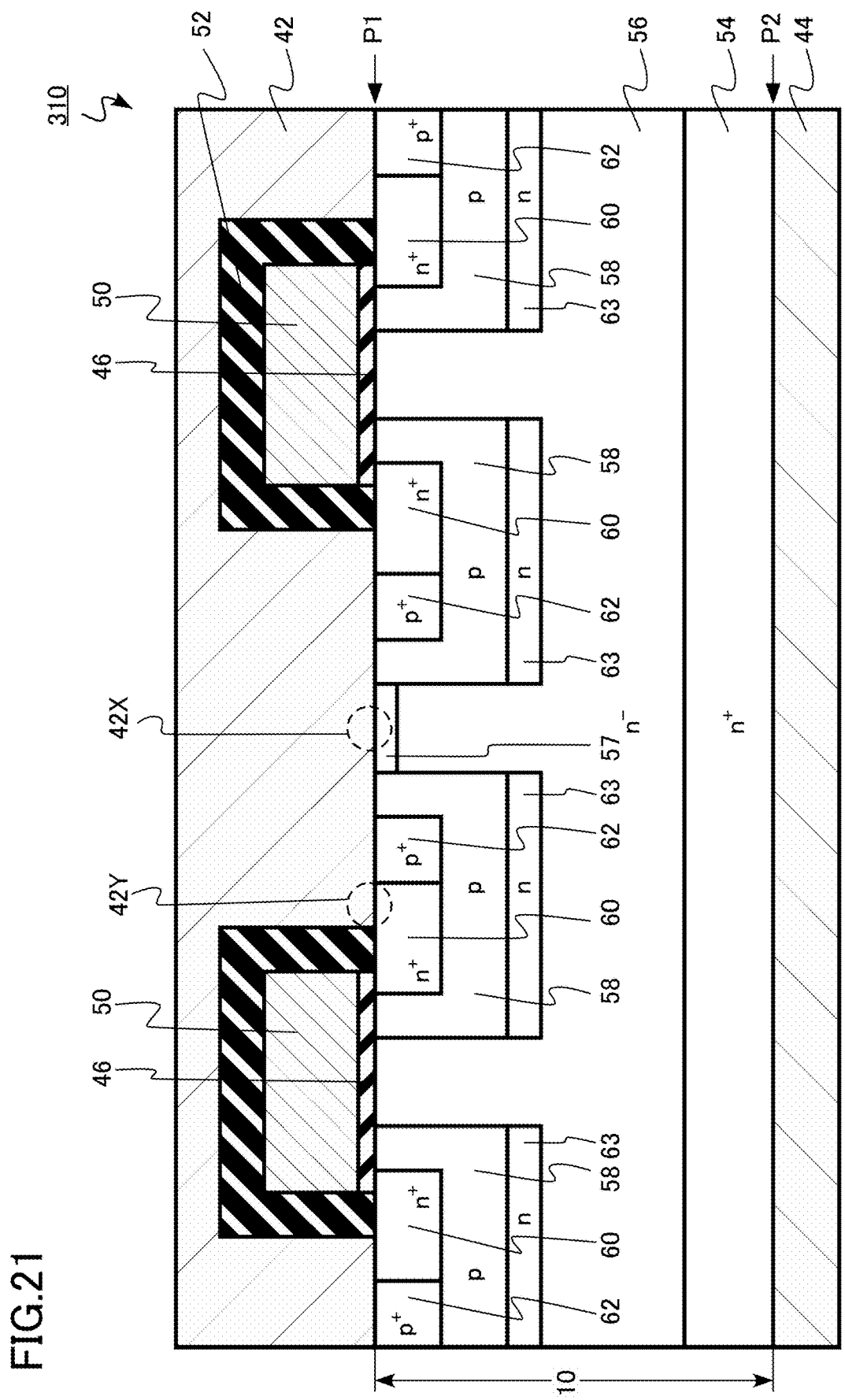
FIG. 21 is a schematic cross sectional view of a semiconductor device of a first modification of the third embodiment.

FIG. 21 is a schematic cross sectional view of the semiconductor device of the first modification of the third embodiment. The semiconductor device of the first modification of the third embodiment is a planar gate type vertical MOSFET 310.

A silicon carbide layer 10 of the MOSFET 310 includes a current diffusion region 63.

The current diffusion region 63 is made of SiC of n-type. The current diffusion region 63 is disposed between a drift region 56 and a p-well region 58.

The current diffusion region 63 contains, for example, nitrogen (N) as n-type impurities. The n-type impurity concentration in the current diffusion region 63 is, for example, $2 \times 10^{15}$ $cm^{-3}$ or more and $5 \times 10^{16}$ $cm^{-3}$ or less. The n-type impurity concentration in the current diffusion region 63 is higher than the n-type impurity concentration in the drift region 56.

By inclusion of the current diffusion region 63 in the MOSFET 310, on-resistance is reduced as compared with that of the MOSFET 300. In other words, on-current of the MOSFET 310 increases as compared with that of the MOSFET 300. In addition, a forward current of an SBD built in the MOSFET 310 also increases as compared with the MOSFET 300.

(Second Modification)

A semiconductor device of a second modification of the third embodiment is different from the semiconductor device of the third embodiment in that a side surface includes a silicide layer in contact with a fourth silicon carbide region.

Figure 22:
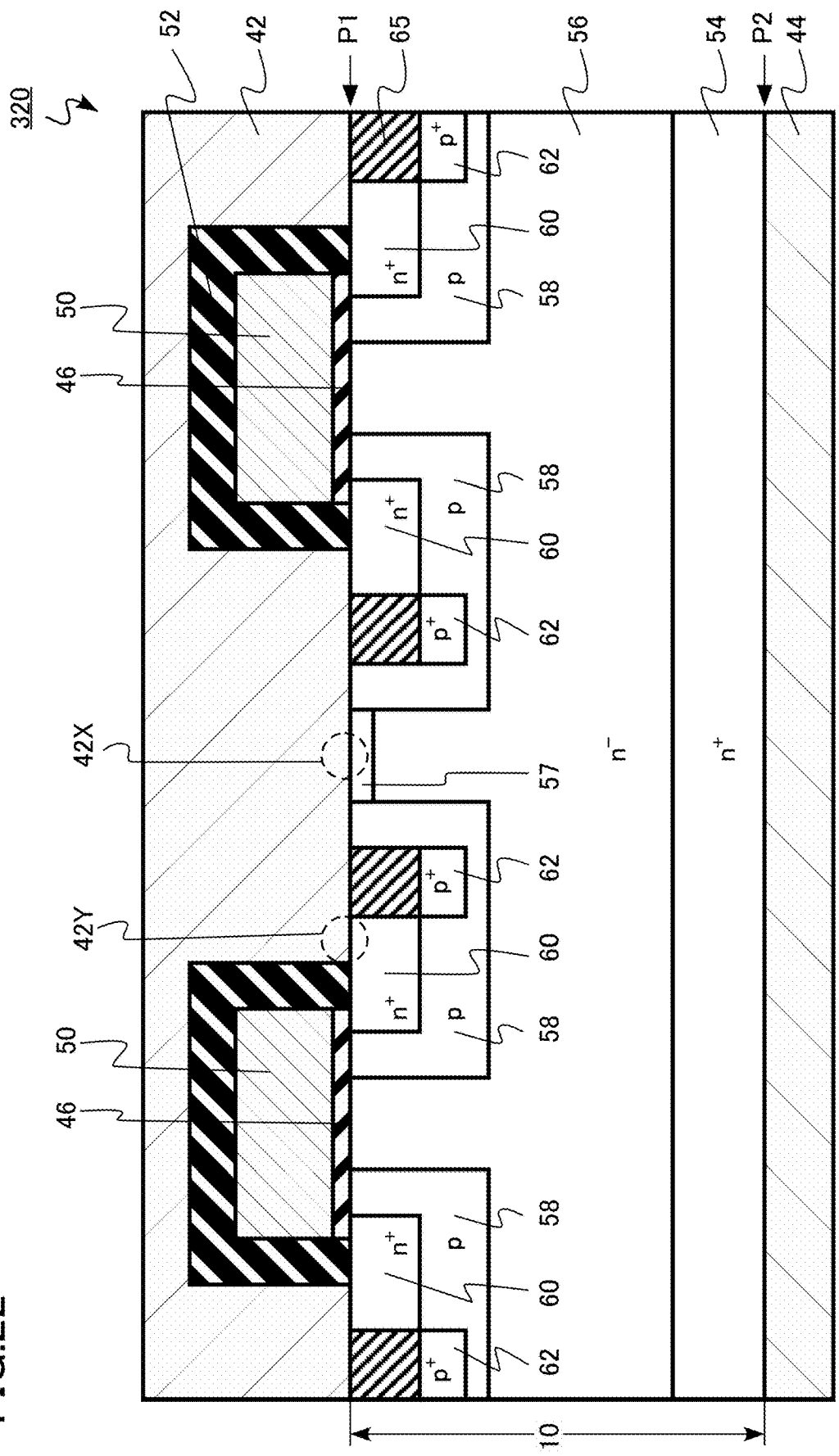
FIG. 22 is a schematic cross sectional view of a semiconductor device of a second modification of the third embodiment.

FIG. 22 is a schematic cross sectional view of the semiconductor device of the second modification of the third embodiment. The semiconductor device of the second modification of the third embodiment is a planar gate type vertical MOSFET 320.

The MOSFET 320 includes a silicide layer 65.

A p-well contact region 62 is deeper than a source region 60.

The silicide layer 65 is provided between a source electrode 42 and the p-well contact region 62. A side surface of the silicide layer 65 is in contact with the source region 60.

The silicide layer 65 is in contact with the source electrode 42. The silicide layer 65 can also be considered as a part of the source electrode 42. The silicide layer 65 is made of, for example, nickel silicide.

By inclusion of the silicide layer 65 in the MOSFET 320, electrical resistance between the source electrode 42 and the source region 60 is reduced. Therefore, on-resistance of the MOSFET 320 is reduced as compared with that of the MOSFET 300. In other words, on-current of the MOSFET 320 increases as compared with that of the MOSFET 300.

As described above, according to the third embodiment and the modifications of the third embodiment, it is possible to achieve a semiconductor device that suppresses variation in Schottky barrier height. In addition, a semiconductor device having a simple device structure and manufactured by a simple manufacturing process can be achieved.

Fourth Embodiment

A semiconductor device of a fourth embodiment is different from the semiconductor device of the third embodiment in that a p-well contact region is in contact with a second silicon carbide region. Hereinafter, descriptions overlapping with the third embodiment will be partially omitted.

Figure 23:
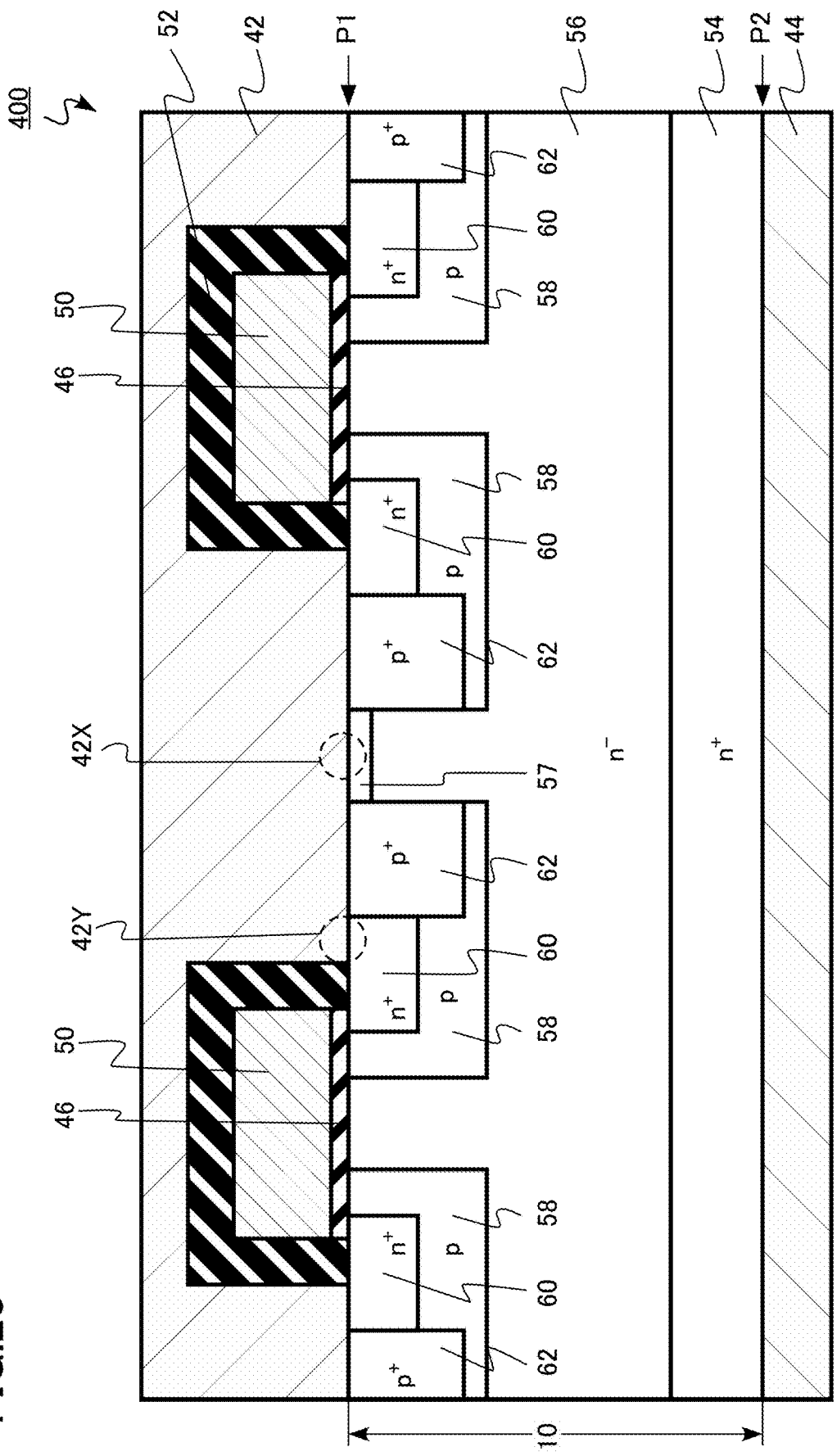
FIG. 23 is a schematic cross sectional view of a semiconductor device of a fourth embodiment.
Figure 24:
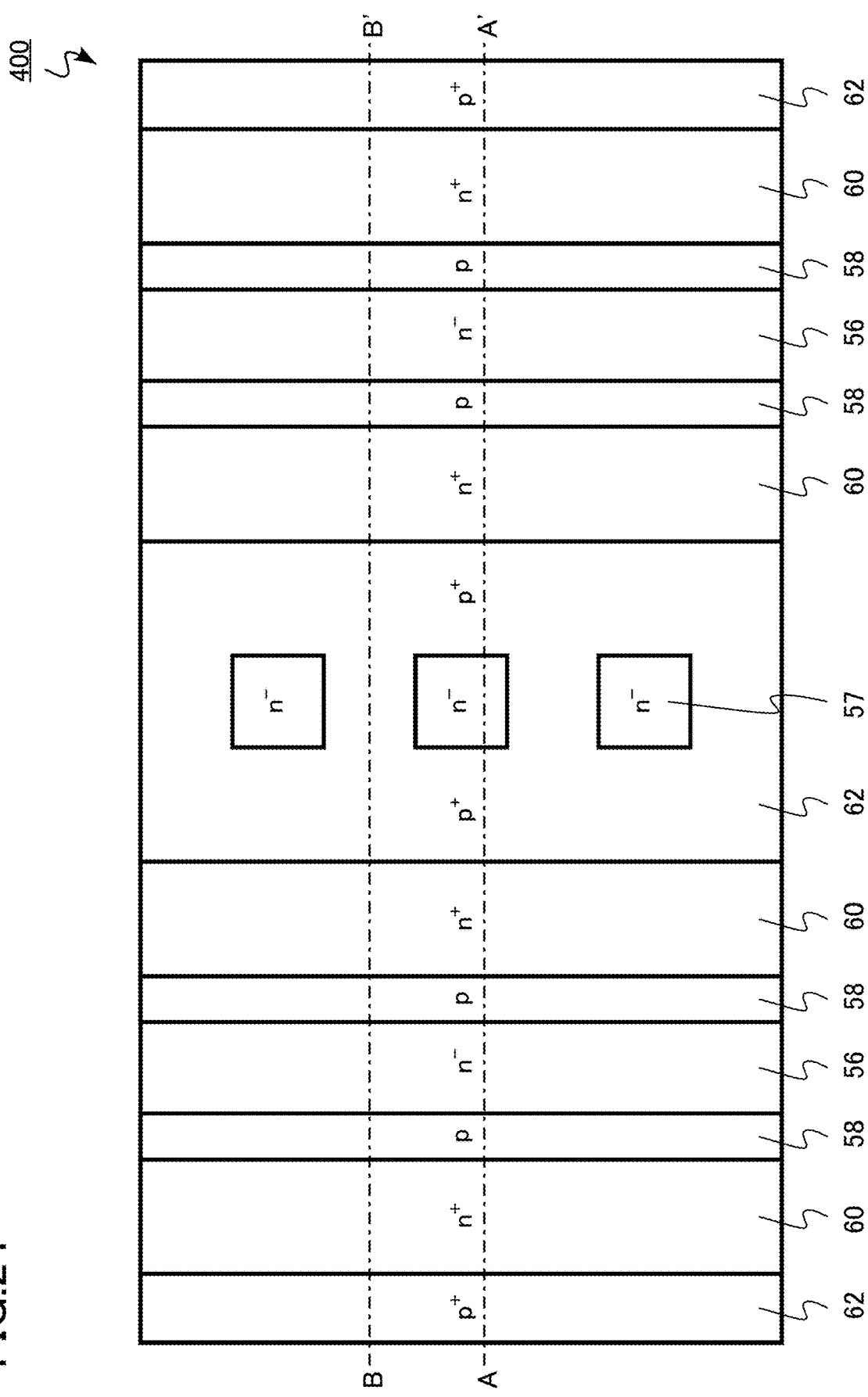
FIG. 24 is a schematic top view of the semiconductor device of the fourth embodiment.
Figure 25:
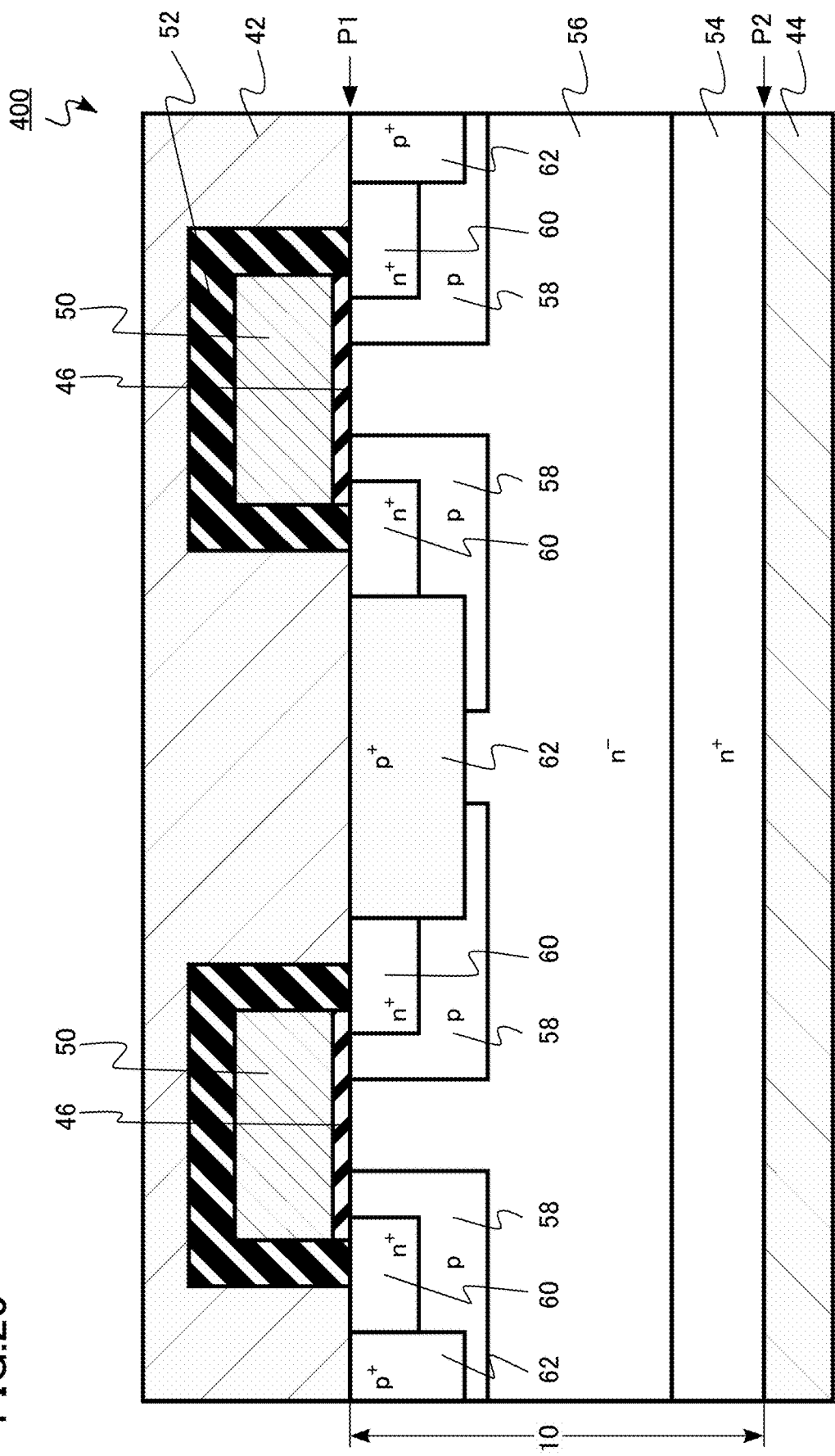
FIG. 25 is a schematic cross sectional view of the semiconductor device of the fourth embodiment.

FIG. 23 is a schematic cross-sectional view of the semiconductor device of the fourth embodiment. FIG. 24 is a schematic top view of the semiconductor device of the fourth embodiment. FIG. 25 is a schematic cross-sectional view of the semiconductor device of the fourth embodiment. FIG. 23 illustrates a cross section cut along AA' in FIG. 24. FIG. 25 illustrates a cross section cut along BB' in FIG. 24.

The semiconductor device of the fourth embodiment is a planar gate type vertical MOSFET 400. The MOSFET 400 is an n-channel type transistor using electrons as carriers.

The MOSFET 400 includes an SBD as a built-in diode. The SBD, which is a built-in diode, has a similar structure to the SBD 100 of the first embodiment. The built-in diode is a merged PiN Schottky (MPS) diode.

The MOSFET 400 includes a silicon carbide layer 10, a source electrode 42 (first electrode), a drain electrode (second electrode), a gate insulating layer 46, a gate electrode 50, and an interlayer insulating layer 52. The source electrode 42 has a first portion 42X and a second portion 42Y.

The source electrode 42 is an example of the first electrode. The drain electrode 44 is an example of the second electrode.

The silicon carbide layer 10 includes a drain region 54, a drift region 56 (first silicon carbide region), a sulfur region 57 (second silicon carbide region), a p-well region 58 (third silicon carbide region), a source region 60 (fourth silicon carbide region), and a p-well contact region 62.

The sulfur region 57 is made of SiC of $n^-$ type. The sulfur region 57 is disposed between the drift region 18 and the source electrode 42. The sulfur region 57 is disposed between the drift region 18 and the first plane P1. The sulfur region 57 is in contact with the source electrode 42.

The sulfur region 57 is surrounded by the p-well contact region 62. The sulfur region 57 is in contact with the p-well contact region 62.

The p-well contact region 62 is made of SiC of $p^+$ type. The p-well contact region 62 is disposed between the p-well region 58 and the source electrode 42. The p-well contact region 62 is disposed between the p-well region 58 and the first plane P1. The p-well contact region 62 is adjacent to the source region 60.

The p-well contact region 62 surrounds the sulfur region 57.

FIGS. 26A, 26B, 26C, 26D, and 26E are top views of the fourth embodiment and modifications. FIGS. 26A, 26B, 26C, 26D, and 26E illustrate layout patterns of the sulfur region 57 and the p-well contact region 62 of the fourth embodiment and modifications.

Figure 26A:
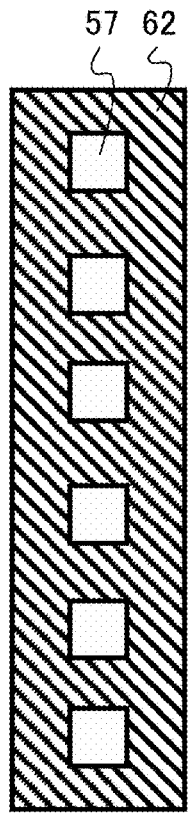
FIGS. 26A, 26B, 26C, 26D, and 26E are top views of the fourth embodiment and modifications.
Figure 26B:
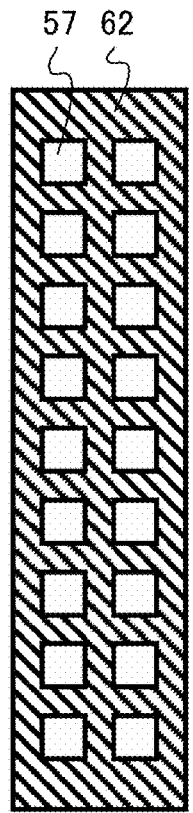
Figure 26C:
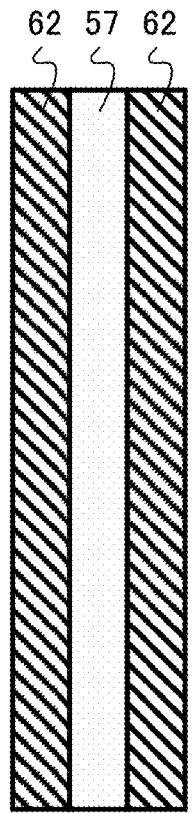
Figure 26D:
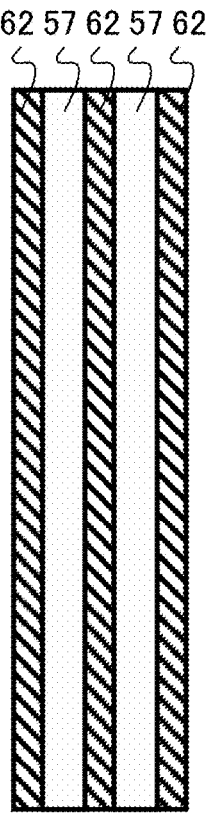
Figure 26E:
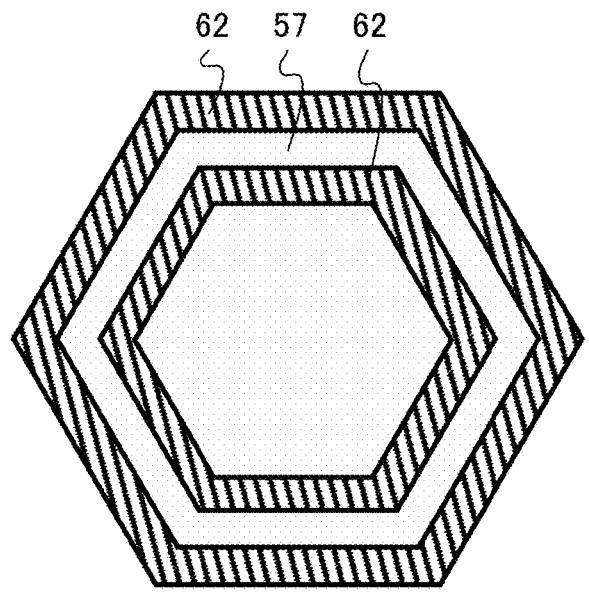

FIG. 26A is a top view of the fourth embodiment, FIG. 26B is a top view of a first modification, FIG. 26C is a top view of a second modification, FIG. 26D is a top view of a third modification, and FIG. 26E is a top view of a fourth modification.

The layout pattern of the sulfur region 57 and the p-well contact region 62 may be a lattice pattern as illustrated in FIG. 26B. The layout pattern of the sulfur region 57 and the p-well contact region 62 may be a stripe pattern as illustrated in FIGS. 26C and 26D. The layout pattern of the sulfur region 57 and the p-well contact region 62 may be a hexagonal pattern as illustrated in FIG. 26E.

As described above, according to the fourth embodiment, it is possible to achieve a semiconductor device that suppresses variation in Schottky barrier height. In addition, a semiconductor device having a simple device structure and manufactured by a simple manufacturing process can be achieved.

Fifth Embodiment

A semiconductor device of a fifth embodiment is different from the semiconductor device of the fourth embodiment in that an interface between a second silicon carbide region and a first electrode is on a second plane side with respect to a first plane. Hereinafter, descriptions overlapping with the fourth embodiment will be partially omitted.

Figure 27:
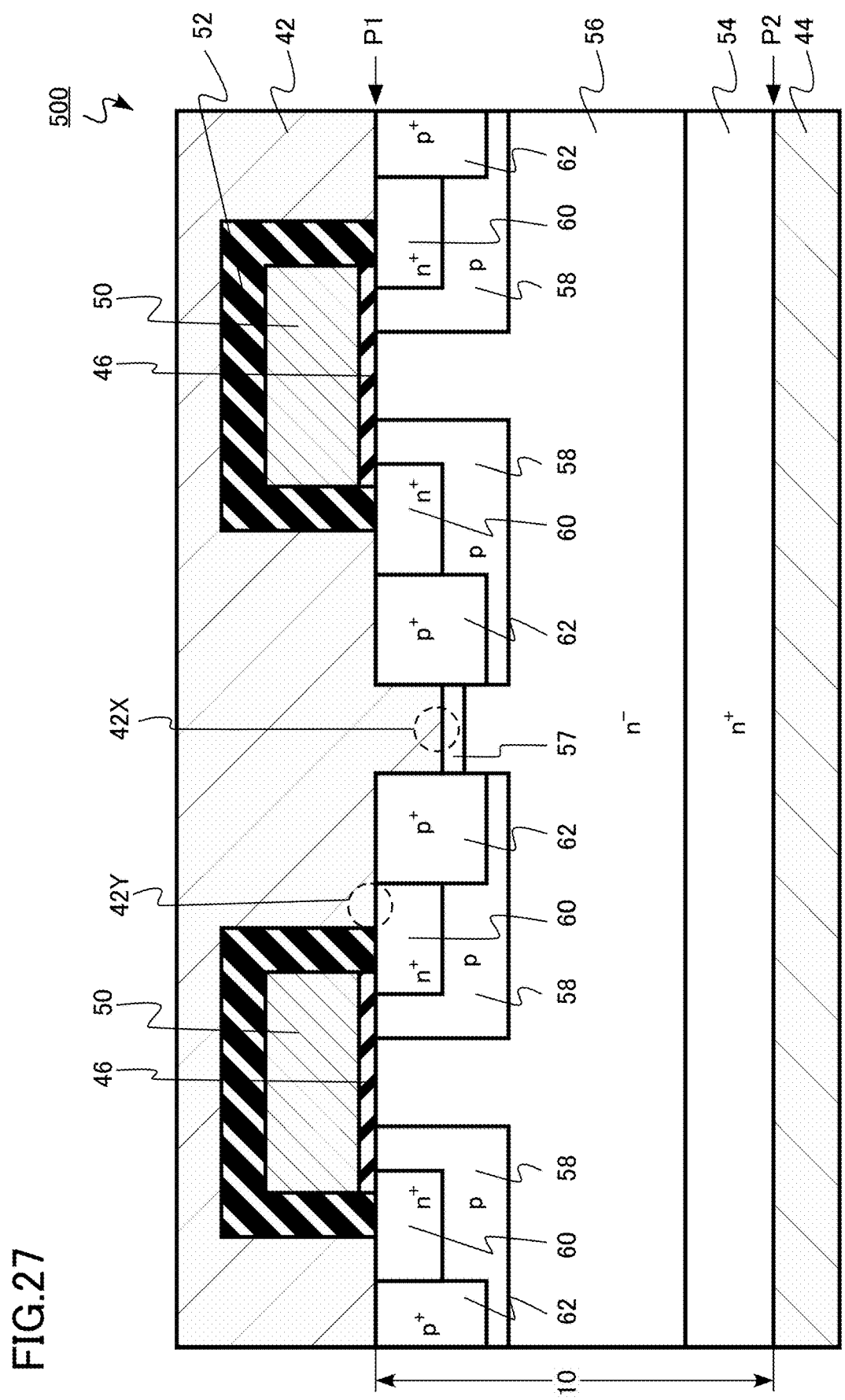
FIG. 27 is a schematic cross sectional view of a semiconductor device of a fifth embodiment.

FIG. 27 is a schematic cross-sectional view of the semiconductor device of the fifth embodiment. FIG. 27 corresponds to FIG. 23 of the fourth embodiment.

The semiconductor device of the fifth embodiment is a planar gate type vertical MOSFET 500. The MOSFET 500 is an n-channel type transistor using electrons as carriers.

The MOSFET 500 includes an SBD as a built-in diode. The SBD, which is a built-in diode, has a similar structure to the SBD 100 of the first embodiment. The built-in diode is an MPS diode.

The MOSFET 500 includes a silicon carbide layer 10, a source electrode 42 (first electrode), a drain electrode (second electrode), a gate insulating layer 46, a gate electrode 50, and an interlayer insulating layer 52. The source electrode 42 has a first portion 42X and a second portion 42Y.

The source electrode 42 is an example of the first electrode. The drain electrode 44 is an example of the second electrode.

The silicon carbide layer 10 includes a drain region 54, a drift region 56 (first silicon carbide region), a sulfur region 57 (second silicon carbide region), a p-well region 58 (third silicon carbide region), a source region 60 (fourth silicon carbide region), and a p-well contact region 62.

The sulfur region 57 is made of SiC of $n^-$ type. The sulfur region 57 is disposed between the drift region 18 and the source electrode 42. The sulfur region 57 is disposed between the drift region 18 and the first plane P1. The sulfur region 57 is in contact with the source electrode 42.

The sulfur region 57 is surrounded by the p-well contact region 62. The sulfur region 57 is in contact with the p-well contact region 62.

An interface between the sulfur region 57 and the source electrode 42 is on the second plane P2 side with respect to the first plane P1. For example, a part of the source electrode 42 is embedded in a groove formed in the silicon carbide layer 10.

(Modification)

A semiconductor device of a modification of the fifth embodiment is different from the semiconductor device of the fifth embodiment in that a pattern in the fourth silicon carbide region is different.

Figure 28:
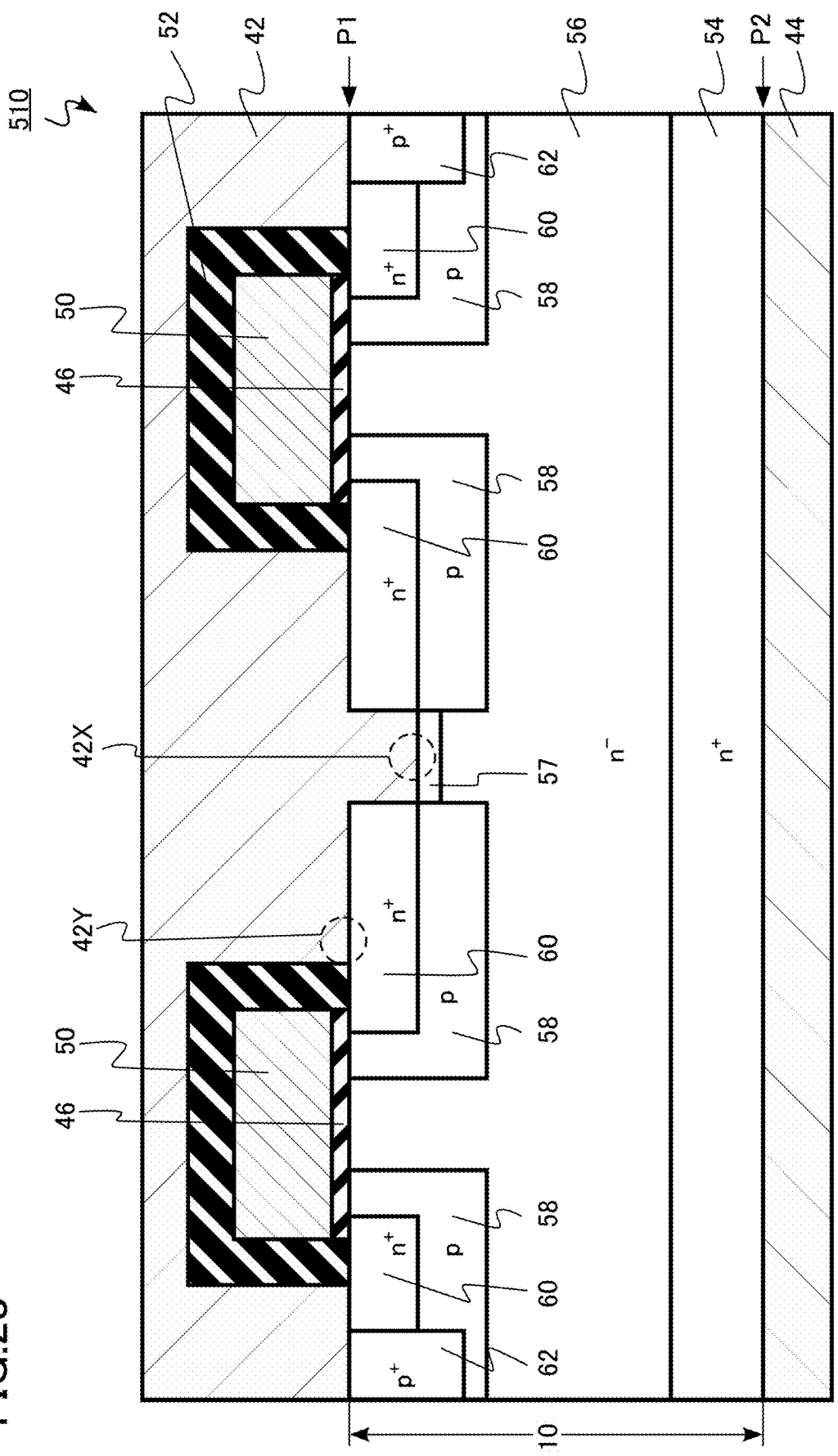
FIG. 28 is a schematic cross sectional view of a semiconductor device of a modification of the fifth embodiment.
Figure 29:
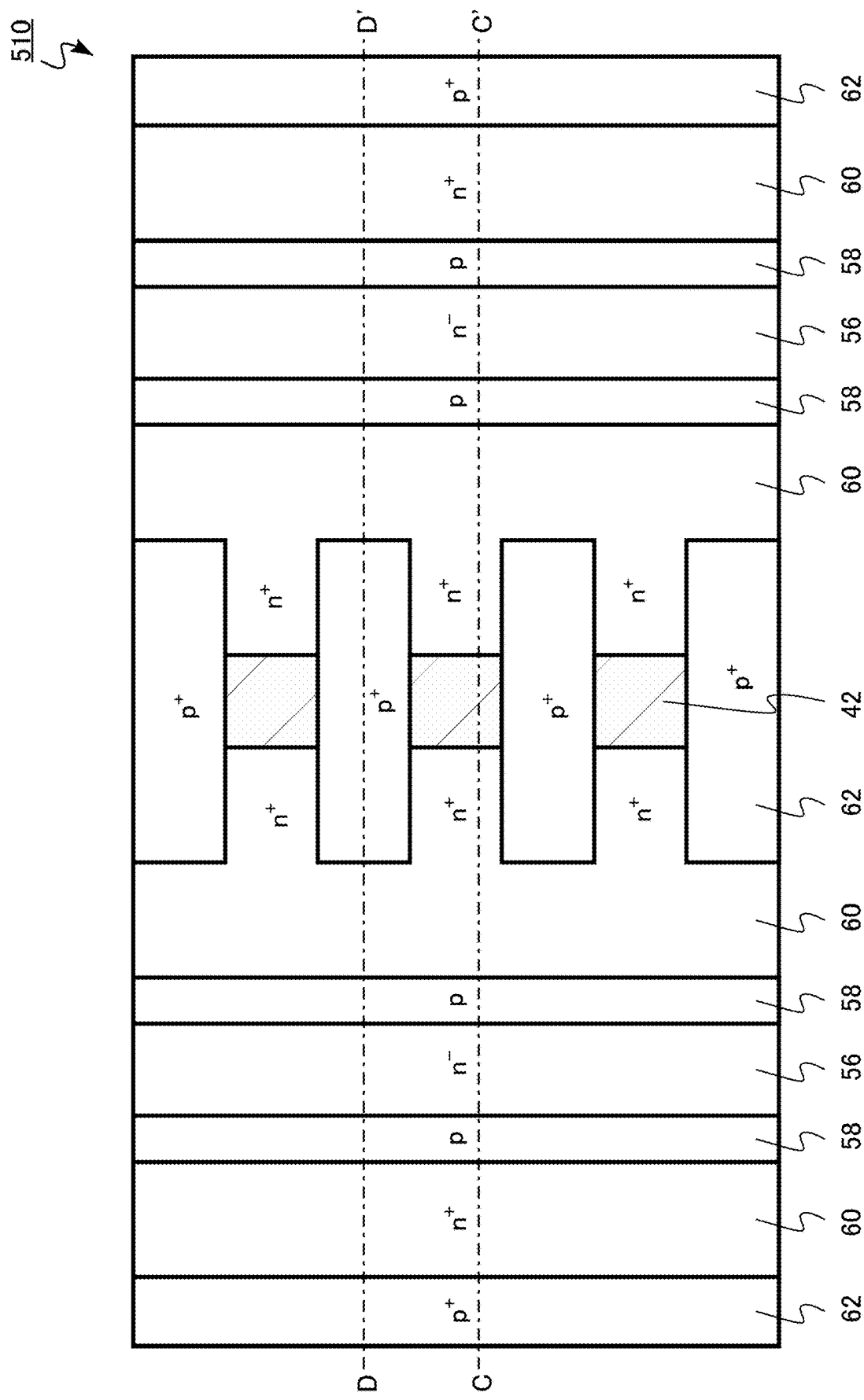
FIG. 29 is a schematic top view of the semiconductor device of the modification of the fifth embodiment.
Figure 30:
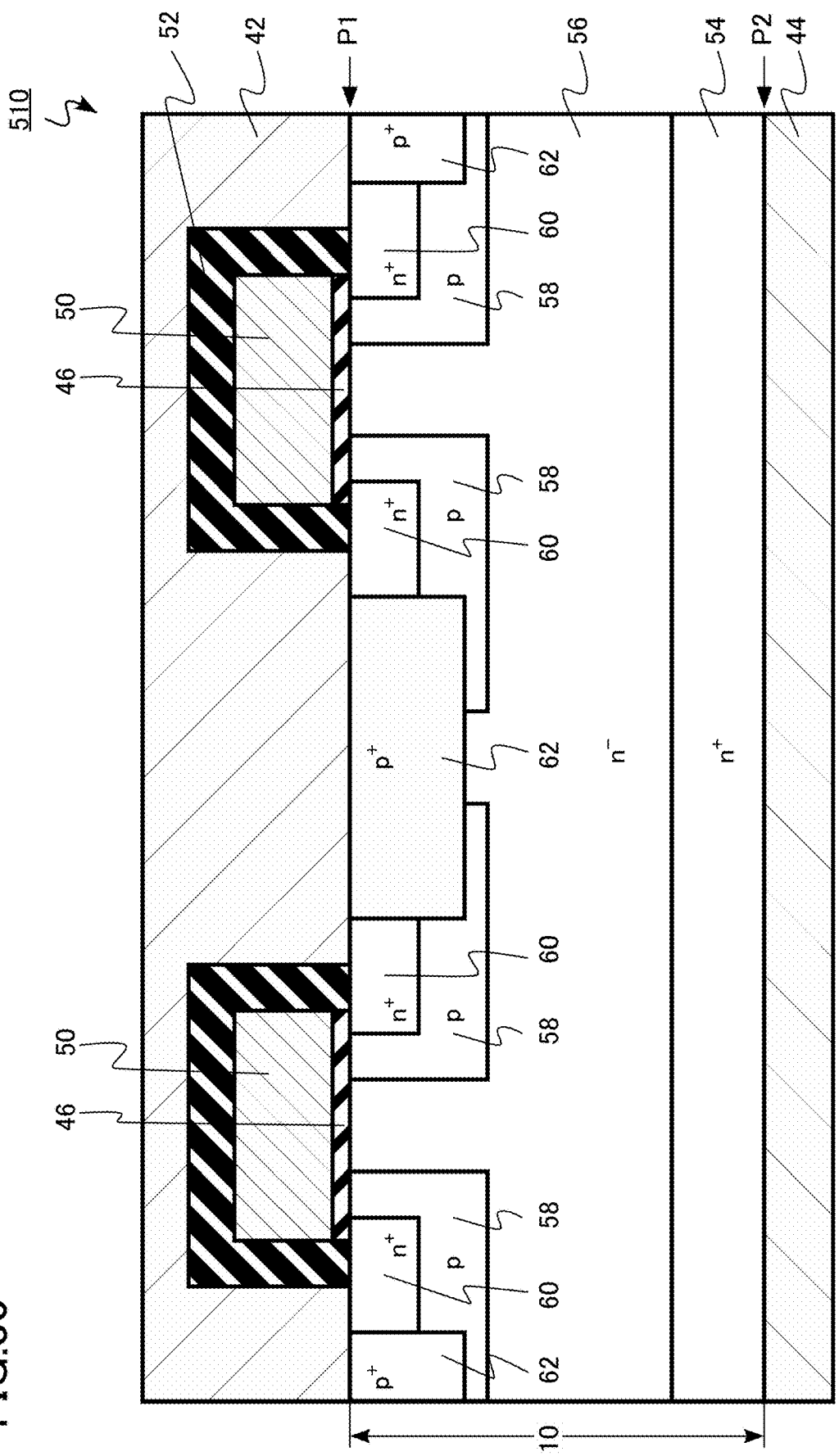
FIG. 30 is a schematic cross sectional view of the semiconductor device of the modification of the fifth embodiment.

FIG. 28 is a schematic cross sectional view of the semiconductor device of the modification of the fifth embodiment. FIG. 29 is a schematic top view of the semiconductor device of the modification of the fifth embodiment. FIG. 30 is a schematic cross sectional view of the semiconductor device of the modification of the fifth embodiment. FIG. 28 illustrates a cross section cut along CC' in FIG. 29. FIG. 30 illustrates a cross section cut along DD' in FIG. 29.

The semiconductor device of the modification of the fifth embodiment is a planar gate type vertical MOSFET 510.

A part of the source electrode 42 is embedded in a groove formed in the silicon carbide layer 10. The source region 60 is in contact with a part of a side surface of the source electrode 42 embedded in the groove.

As illustrated in FIG. 29, on the first plane P1 of the silicon carbide layer 10, the source region 60 is interposed between the p-well contact regions 62.

The sulfur region 57 is surrounded by the p-well contact region 62 and the p-well region 58.

According to the MOSFET 510, electrical resistance between the source electrode 42 and the source region 60 is reduced as compared with that of the MOSFET 500. Therefore, on-resistance of the MOSFET 510 is reduced as compared with that of the MOSFET 500. In other words, on-current of the MOSFET 510 increases as compared with that of the MOSFET 500.

As described above, according to the fifth embodiment and the modification of the fifth embodiment, it is possible to achieve a semiconductor device that suppresses variation in Schottky barrier height. In addition, a semiconductor device having a simple device structure and manufactured by a simple manufacturing process can be achieved.

Sixth Embodiment

A semiconductor device of a sixth embodiment is different from the semiconductor device of the third embodiment in including a gate trench and a source trench. Hereinafter, descriptions overlapping with the third embodiment will be partially omitted.

Figure 31:
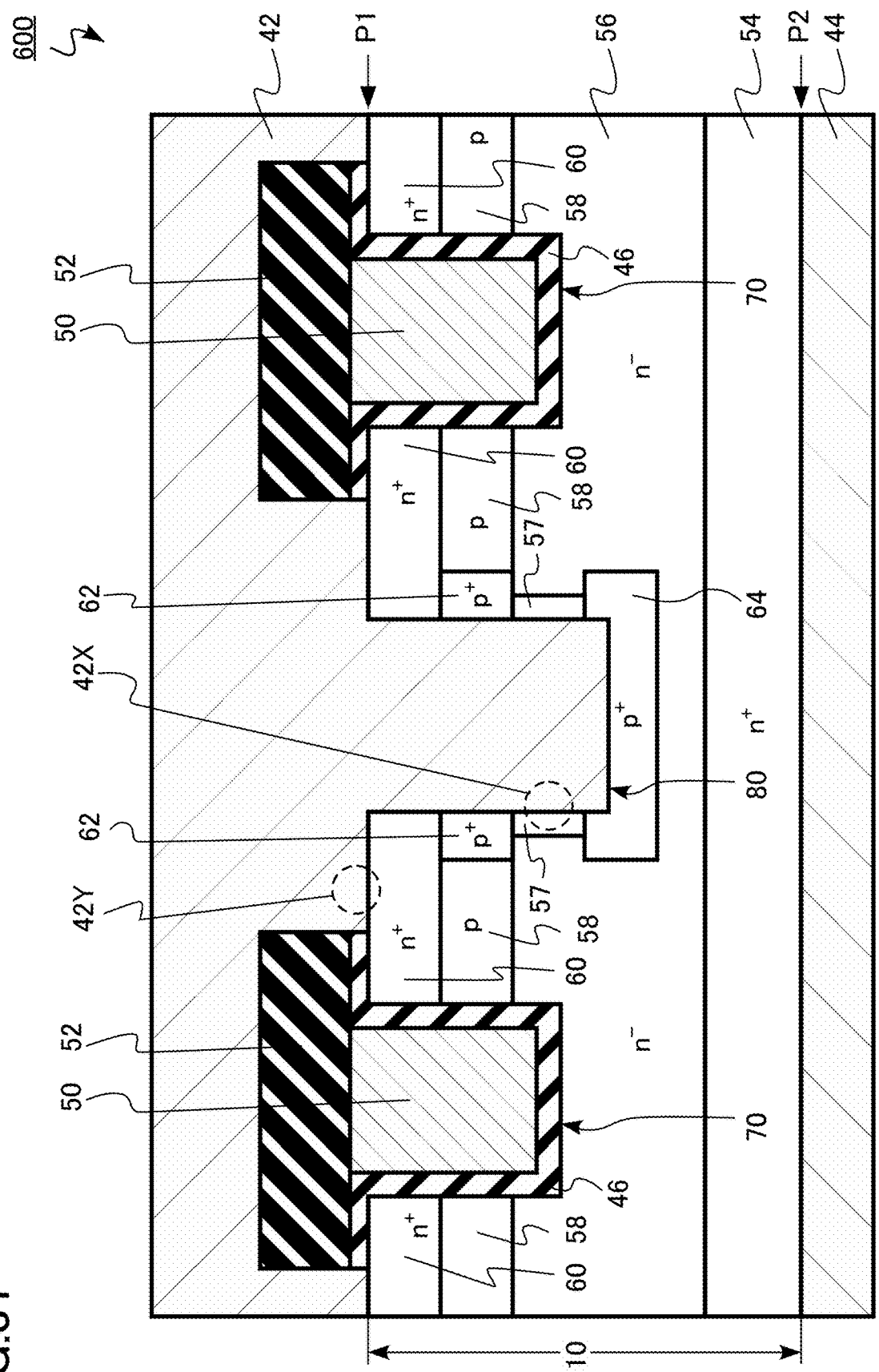
FIG. 31 is a schematic cross sectional view of a semiconductor device of a sixth embodiment.

FIG. 31 is a schematic cross-sectional view of the semiconductor device of the sixth embodiment. The semiconductor device of the sixth embodiment is a trench gate type vertical MOSFET 600. In the MOSFET 600, a part of a source electrode is provided in a source trench. The MOSFET 600 is a MOSFET having a so-called double trench structure. The MOSFET 600 is an n-channel type transistor using electrons as carriers.

The MOSFET 600 includes an SBD as a built-in diode. The SBD, which is a built-in diode, has a similar structure to the SBD 100 of the first embodiment.

The MOSFET 600 includes a silicon carbide layer 10, a source electrode 42 (first electrode), a drain electrode (second electrode), a gate insulating layer 46, a gate electrode 50, and an interlayer insulating layer 52. The source electrode 42 has a first portion 42X and a second portion 42Y.

The source electrode 42 is an example of the first electrode. The drain electrode 44 is an example of the second electrode.

The silicon carbide layer 10 includes a drain region 54, a drift region 56 (first silicon carbide region), a sulfur region 57 (second silicon carbide region), a p-well region 58 (third silicon carbide region), a source region 60 (fourth silicon carbide region), a p-well contact region 62, an electric field relaxation region 64, a gate trench 70, and a source trench 80.

The gate trench 70 is provided on the first plane P1 side of the silicon carbide layer 10. The depth of the gate trench 70 is deeper than the depth of the p-well region 58.

The gate insulating layer 46 is provided in the gate trench 70. The gate electrode 50 is provided in the gate trench 70. The gate electrode 50 is provided on the gate insulating layer 46.

The source trench 80 is provided on the first plane P1 side of the silicon carbide layer 10. The depth of the source trench 80 is deeper than the depth of the p-well region 58.

A part of the source electrode 42 is provided in the source trench 80. The sulfur region 57 is in contact with the source electrode 42 on a side surface of the source trench 80. The p-well contact region 62 is in contact with the source electrode 42 on the side surface of the source trench 80.

The electric field relaxation region 64 is made of SiC of $p^+$ type. The electric field relaxation region 64 is provided between the drift region 56 and the source trench 80. The electric field relaxation region 64 is provided at a bottom of the source trench 80. The electric field relaxation region 64 has a function of reducing electric field strength applied to the gate insulating layer 46 in the gate trench 70.

The electric field relaxation region 64 contains, for example, aluminum as a p-type impurities. The p-type impurity concentration in the electric field relaxation region 64 is, for example, $1 \times 10^{18}$ cm$^{-3}$ or more and $1 \times 10^{22}$ cm$^{-3}$ or less. The p-type impurity concentration in the electric field relaxation region 64 is higher than the p-type impurity concentration in the p-well region 58.

According to the MOSFET 600 of the sixth embodiment, with the double trench structure, scaling-down is possible, and on-resistance per unit area can be reduced.

As described above, according to the sixth embodiment, it is possible to achieve a semiconductor device that suppresses variation in Schottky barrier height. In addition, a semiconductor device having a simple device structure and manufactured by a simple manufacturing process can be achieved. In addition, a semiconductor device capable of reducing on-resistance per unit area can be achieved.

Seventh Embodiment

A semiconductor device of a seventh embodiment is different from the semiconductor device of the sixth embodiment in that a sulfur region is provided at a bottom of a source trench. Hereinafter, descriptions overlapping with the sixth embodiment will be partially omitted.

Figure 32:
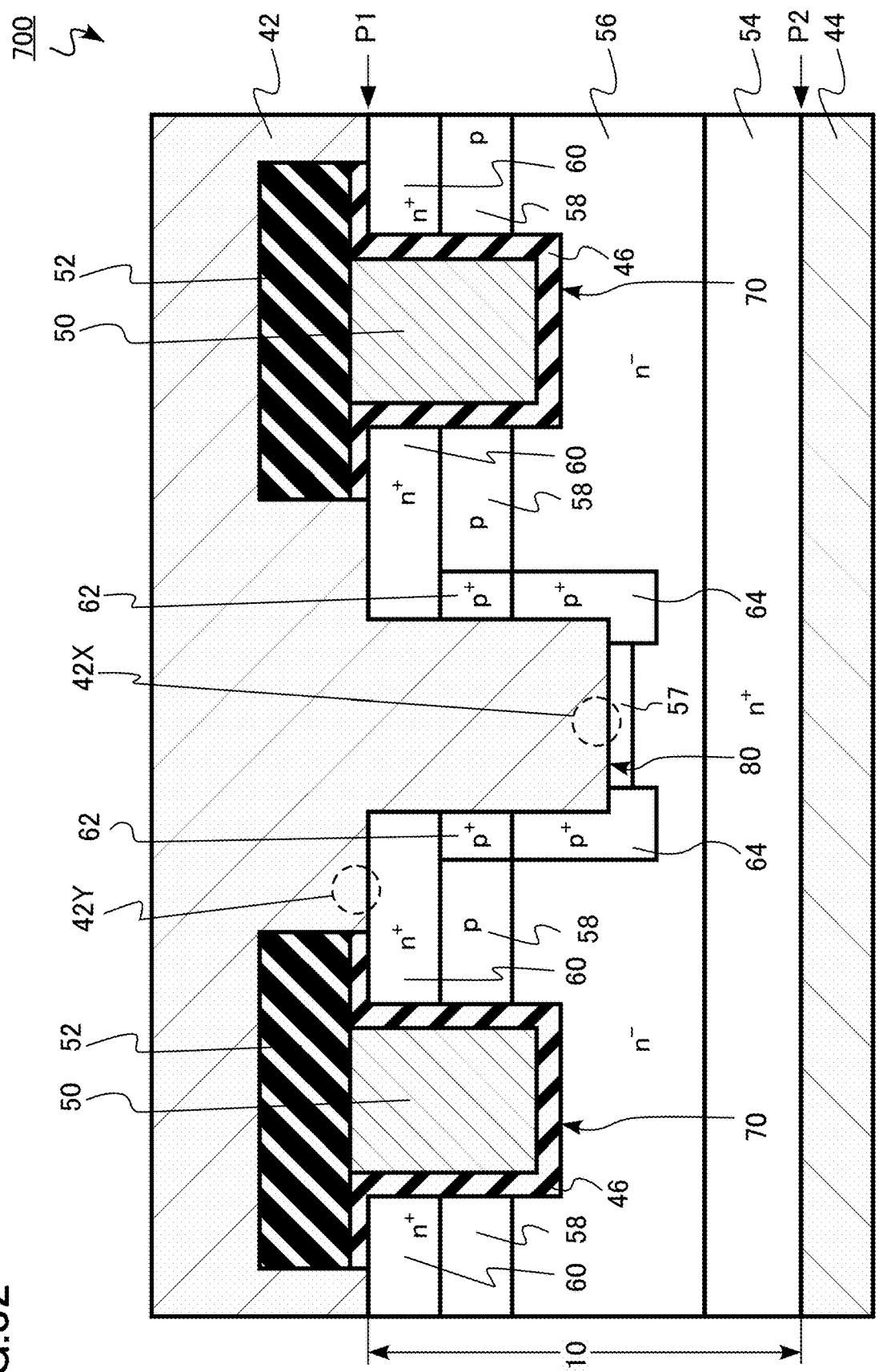
FIG. 32 is a schematic cross sectional view of a semiconductor device of a seventh embodiment.

FIG. 32 is a schematic cross-sectional view of the semiconductor device of the seventh embodiment. The semiconductor device of the seventh embodiment is a trench gate type vertical MOSFET 700. In the MOSFET 700, a part of a source electrode is provided in a source trench. The MOSFET 700 is a MOSFET having a so-called double trench structure. The MOSFET 700 is an n-channel type transistor using electrons as carriers.

The MOSFET 700 includes an SBD as a built-in diode. The SBD, which is a built-in diode, has a similar structure to the SBD 100 of the first embodiment.

The MOSFET 700 includes a silicon carbide layer 10, a source electrode 42 (first electrode), a drain electrode (second electrode), a gate insulating layer 46, a gate electrode 50, and an interlayer insulating layer 52. The source electrode 42 has a first portion 42X and a second portion 42Y.

The source electrode 42 is an example of the first electrode. The drain electrode 44 is an example of the second electrode.

The silicon carbide layer 10 includes a drain region 54, a drift region 56 (first silicon carbide region), a sulfur region 57 (second silicon carbide region), a p-well region 58 (third silicon carbide region), a source region 60 (fourth silicon carbide region), a p-well contact region 62, an electric field relaxation region 64, a gate trench 70, and a source trench 80.

A part of the source electrode 42 is provided in the source trench 80. The sulfur region 57 is in contact with the source electrode 42 at a bottom of the source trench 80. The p-well contact region 62 is in contact with the source electrode 42 on the side surface of the source trench 80.

The electric field relaxation region 64 is made of SiC of $p^+$ type. The electric field relaxation region 64 is provided between the drift region 56 and the gate trench 70.

According to the MOSFET 700 of the seventh embodiment, with the double trench structure, scaling-down is possible, and on-resistance per unit area can be reduced.

As described above, according to the seventh embodiment, it is possible to achieve a semiconductor device that suppresses variation in Schottky barrier height. In addition, a semiconductor device having a simple device structure and manufactured by a simple manufacturing process can be achieved. In addition, a semiconductor device capable of reducing on-resistance per unit area can be achieved.

Eighth Embodiment

A semiconductor device of an eighth embodiment is different from the semiconductor device of the sixth embodiment in that two source trenches are provided and the sulfur region is in contact with the first electrode on a first plane. Hereinafter, descriptions overlapping with the sixth embodiment will be partially omitted.

Figure 33:
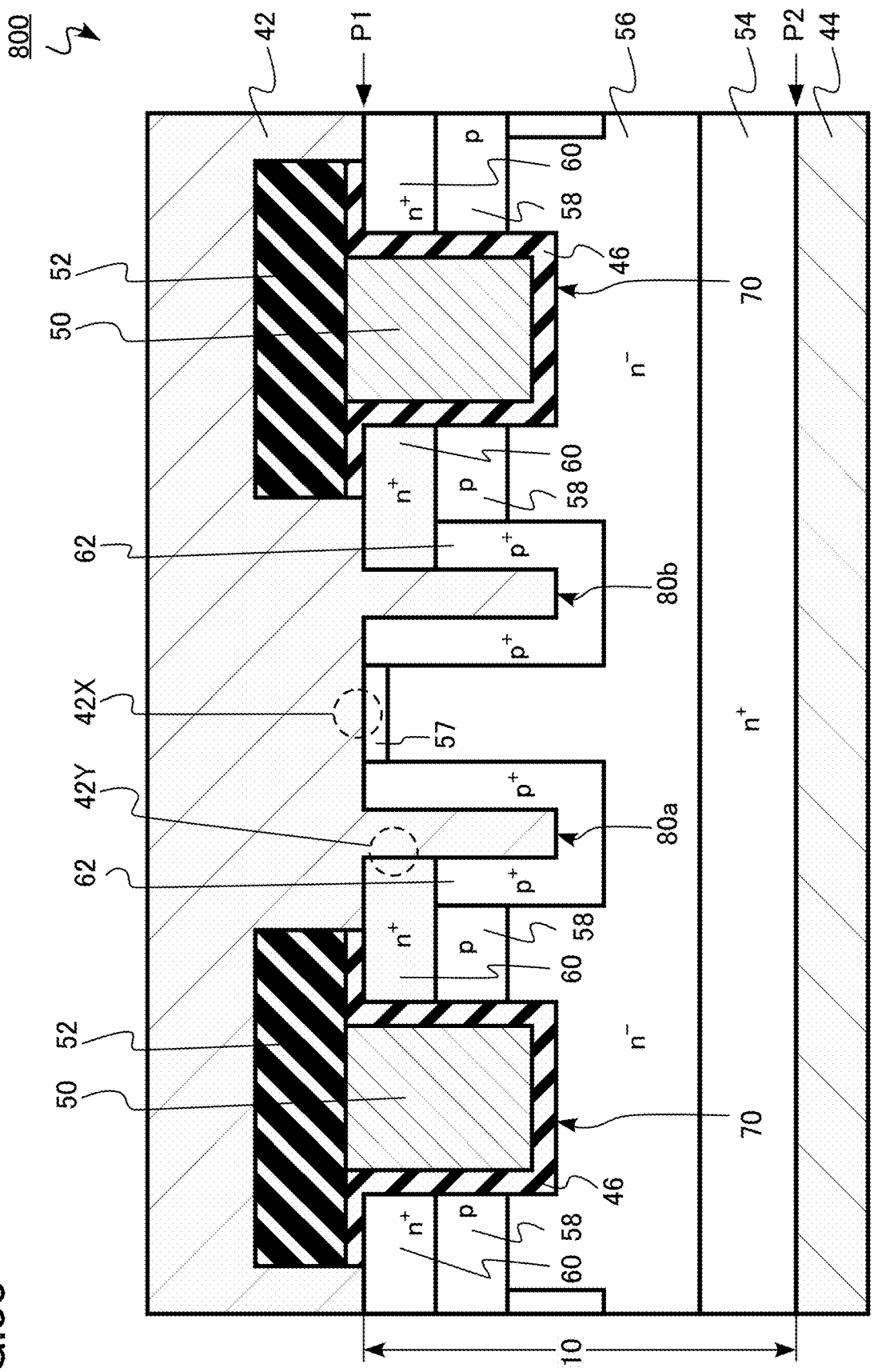
FIG. 33 is a schematic cross sectional view of a semiconductor device of an eighth embodiment.
Figure 34:
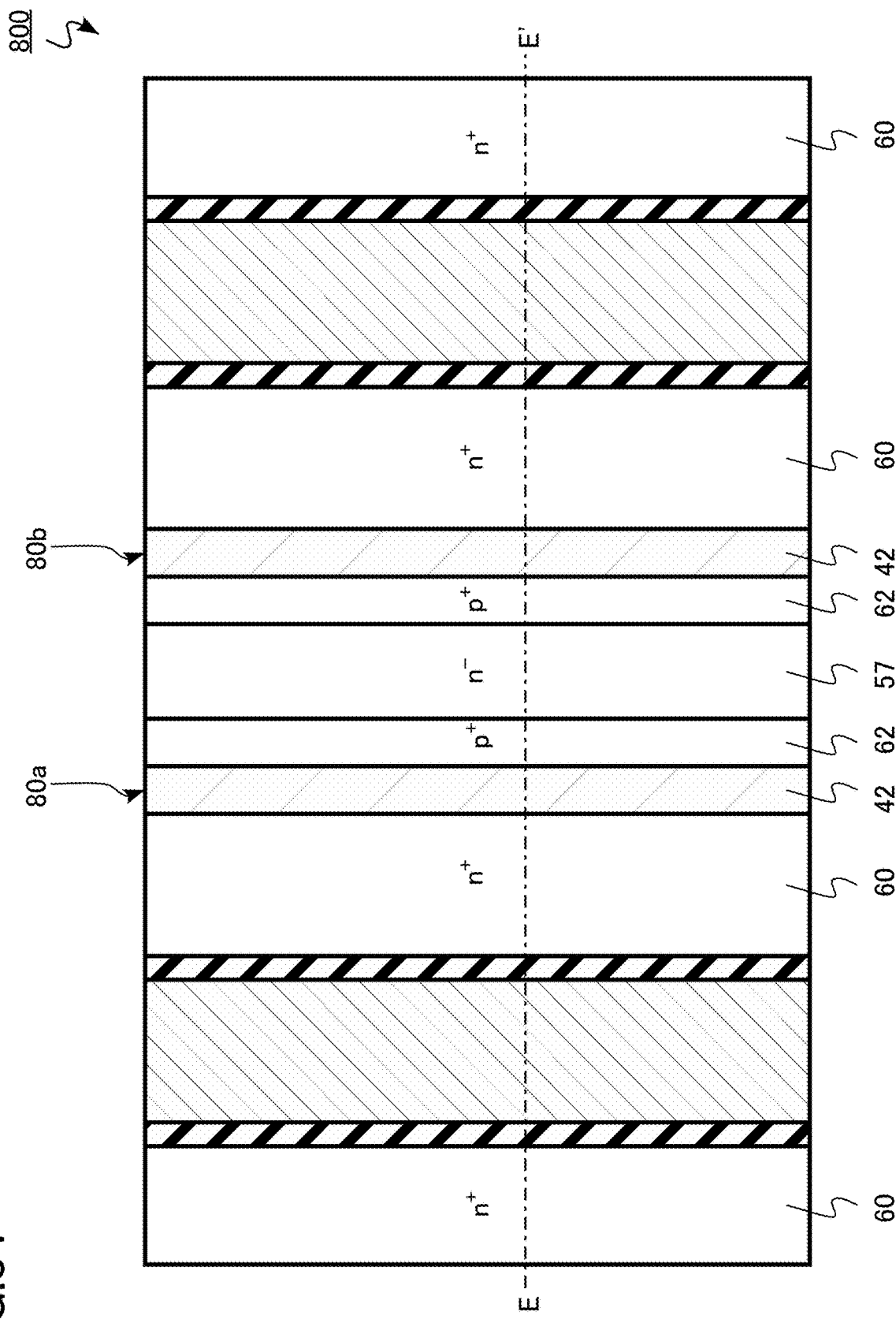
FIG. 34 is a schematic top view of the semiconductor device of the eighth embodiment.

FIG. 33 is a schematic cross-sectional view of the semiconductor device of the eighth embodiment. FIG. 34 is a schematic top view of the semiconductor device of the eighth embodiment. FIG. 33 illustrates a cross section cut along EE' in FIG. 34.

The semiconductor device of the eighth embodiment is a trench gate type vertical MOSFET 800. In the MOSFET 800, a part of a source electrode is provided in a source trench. The MOSFET 800 is a MOSFET having a so-called double trench structure. The MOSFET 800 is an n-channel type transistor using electrons as carriers.

The MOSFET 800 includes an SBD as a built-in diode. The SBD, which is a built-in diode, has a similar structure to the SBD 100 of the first embodiment. The built-in diode is an MPS diode.

The MOSFET 800 includes a silicon carbide layer 10, a source electrode 42 (first electrode), a drain electrode (second electrode), a gate insulating layer 46, a gate electrode 50, and an interlayer insulating layer 52. The source electrode 42 has a first portion 42X and a second portion 42Y.

The source electrode 42 is an example of the first electrode. The drain electrode 44 is an example of the second electrode.

The silicon carbide layer 10 includes a drain region 54, a drift region 56 (first silicon carbide region), a sulfur region 57 (second silicon carbide region), a p-well region 58 (third silicon carbide region), a source region 60 (fourth silicon carbide region), a p-well contact region 62, a gate trench 70, a first source trench 80a, and a second source trench 80b.

A part of the source electrode 42 is provided in the first source trench 80a and the second source trench 80b. The sulfur region 57 is in contact with the source electrode 42 on a first plane P1.

The sulfur region 57 is interposed between the first source trench 80a and the second source trench 80b. The sulfur region 57 is interposed between the p-well contact regions 62. The sulfur region 57 is in contact with the p-well contact region 62. The p-well contact region 62 also functions as an electric field relaxation region.

As described above, according to the eighth embodiment, it is possible to achieve a semiconductor device that suppresses variation in Schottky barrier height. In addition, a semiconductor device having a simple device structure and manufactured by a simple manufacturing process can be achieved. In addition, a semiconductor device capable of reducing on-resistance per unit area can be achieved.

Ninth Embodiment

A semiconductor device of a ninth embodiment is different from the semiconductor device of the eighth embodiment in that another trench is further provided between two source trenches. Hereinafter, descriptions overlapping with the eighth embodiment will be partially omitted.

Figure 35:
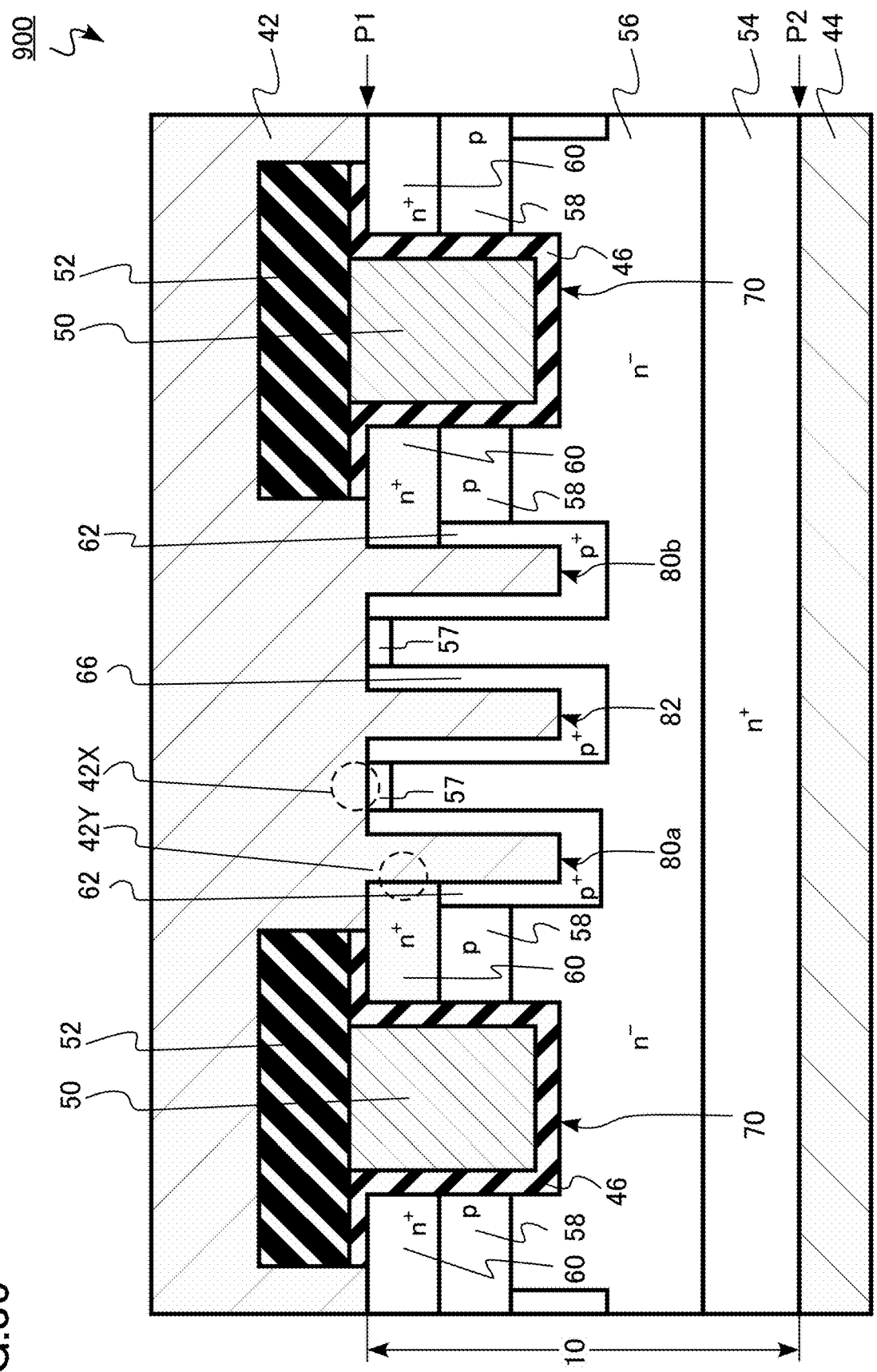
FIG. 35 is a schematic cross sectional view of a semiconductor device of a ninth embodiment.

FIG. 35 is a schematic cross-sectional view of the semiconductor device of the ninth embodiment. FIG. 35 corresponds to FIG. 33 of the eighth embodiment.

The semiconductor device of the ninth embodiment is a trench gate type vertical MOSFET 900. In the MOSFET 900, a part of a source electrode is provided in a source trench. The MOSFET 900 is a MOSFET having a so-called double trench structure. The MOSFET 900 is an n-channel type transistor using electrons as carriers.

The MOSFET 900 includes an SBD as a built-in diode. The SBD, which is a built-in diode, has a similar structure to the SBD 100 of the first embodiment. The built-in diode is an MPS diode.

The MOSFET 900 includes a silicon carbide layer 10, a source electrode 42 (first electrode), a drain electrode 44 (second electrode), a gate insulating layer 46, a gate electrode 50, and an interlayer insulating layer 52. The source electrode 42 has a first portion 42X and a second portion 42Y.

The source electrode 42 is an example of the first electrode. The drain electrode 44 is an example of the second electrode.

The silicon carbide layer 10 includes a drain region 54, a drift region 56 (first silicon carbide region), a sulfur region 57 (second silicon carbide region), a p-well region 58 (third silicon carbide region), a source region 60 (fourth silicon carbide region), a p-well contact region 62, a p-region 66, a gate trench 70, a first source trench 80a, a second source trench 80b, and an intermediate trench 82.

The intermediate trench 82 is provided between the first source trench 80a and the second source trench 80b.

A part of the source electrode 42 is provided in the first source trench 80a, the second source trench 80b, and the intermediate trench 82. The sulfur region 57 is in contact with the source electrode 42 on a first plane P1.

The sulfur region 57 is interposed between the first source trench 80a and the intermediate trench 82. The sulfur region 57 is interposed between the intermediate trench 82 and the second source trench 80b. The sulfur region 57 is interposed between the p-well contact region 62 and the p-region 66.

The sulfur region 57 is in contact with the p-well contact region 62 and the p-region 66.

As described above, according to the ninth embodiment, it is possible to achieve a semiconductor device that suppresses variation in Schottky barrier height. In addition, a semiconductor device having a simple device structure and manufactured by a simple manufacturing process can be achieved. In addition, a semiconductor device capable of reducing on-resistance per unit area can be achieved.

Tenth Embodiment

An inverter circuit and a drive device of a tenth embodiment are an inverter circuit and a drive device each including the semiconductor device of the third embodiment.

Figure 36:
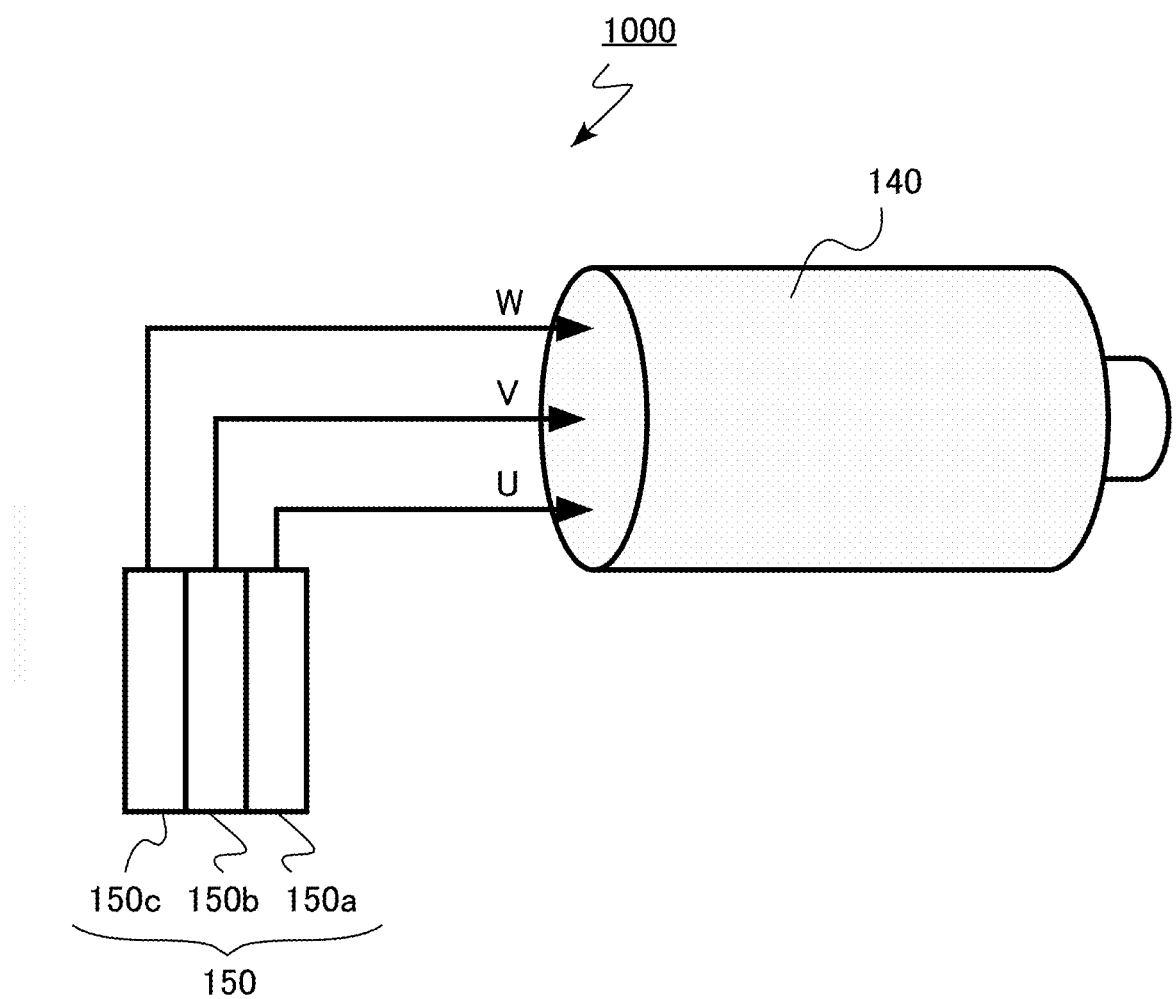
FIG. 36 is a schematic view of a drive device of a tenth embodiment.

FIG. 36 is a schematic view of the drive device of the tenth embodiment. A drive device 1000 includes a motor 140 and an inverter circuit 150.

The inverter circuit 150 includes three semiconductor modules 150a, 150b, and 150c each including the MOSFET 300 of the third embodiment as a switching element. By connecting the three semiconductor modules 150a, 150b, and 150c in parallel, the three-phase inverter circuit 150 having three AC voltage output terminals U, V, and W is achieved. The motor 140 is driven by AC voltage output from the inverter circuit 150.

According to the tenth embodiment, by inclusion of the MOSFET 300 with improved characteristics, the characteristics of the inverter circuit 150 and the drive device 1000 are improved.

Eleventh Embodiment

A vehicle of an eleventh embodiment is a vehicle including the semiconductor device of the third embodiment.

Figure 37:
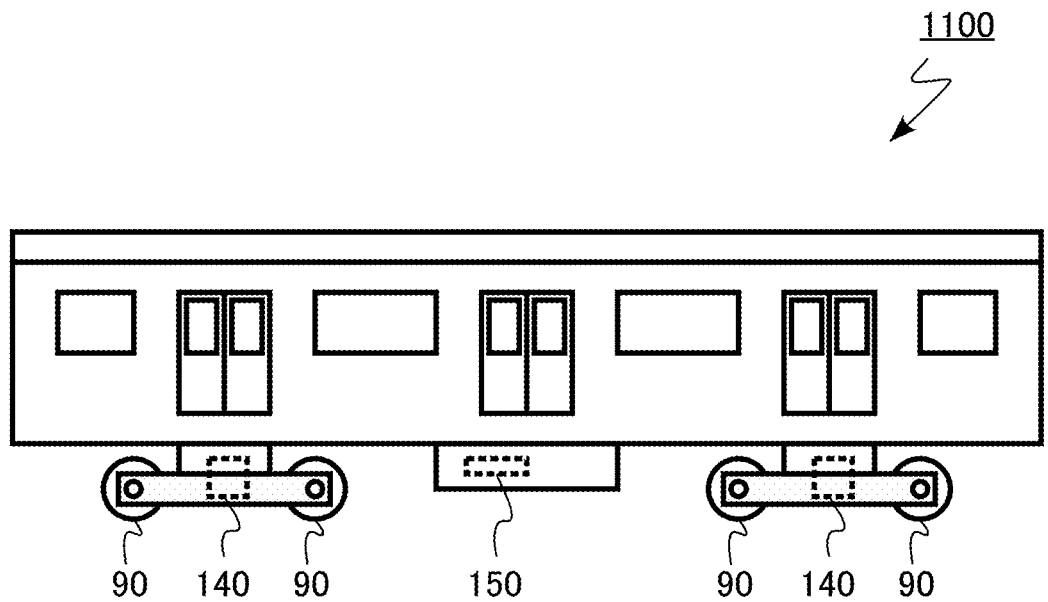
FIG. 37 is a schematic view of a vehicle of an eleventh embodiment.

FIG. 37 is a schematic view of the vehicle of the eleventh embodiment. A vehicle 1100 of the eleventh embodiment is a railroad vehicle. The vehicle 1100 includes a motor 140 and an inverter circuit 150.

The inverter circuit 150 includes three semiconductor modules each including the MOSFET 300 of the third embodiment as a switching element. By connecting the three semiconductor modules in parallel, the three-phase inverter circuit 150 having three AC voltage output terminals U, V, and W is achieved. The motor 140 is driven by AC voltage output from the inverter circuit 150. The motor 140 rotates wheels 90 of the vehicle 1100.

According to the eleventh embodiment, by inclusion of the MOSFET 300 with improved characteristics, the characteristics of the vehicle 1100 are improved.

Twelfth Embodiment

A vehicle of a twelfth embodiment is a vehicle including the semiconductor device of the third embodiment.

Figure 38:
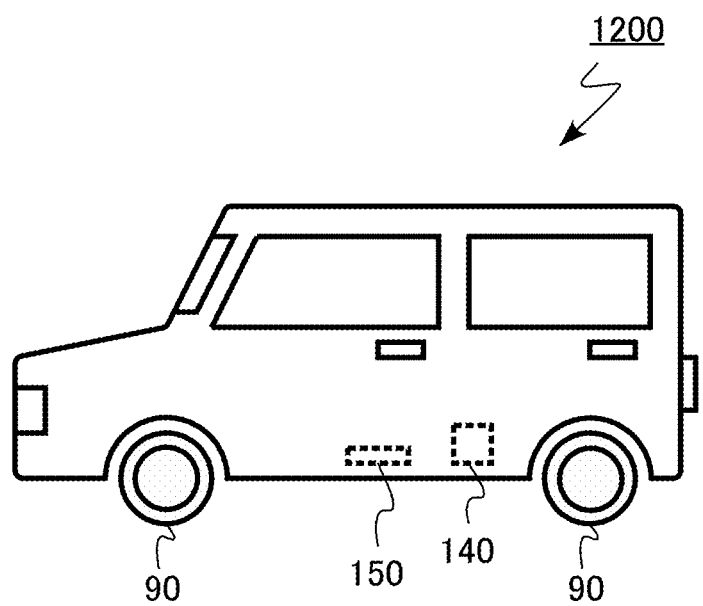
FIG. 38 is a schematic view of a vehicle of a twelfth embodiment.

FIG. 38 is a schematic view of the vehicle of the twelfth embodiment. A vehicle 1200 of the twelfth embodiment is an automobile. The vehicle 1200 includes a motor 140 and an inverter circuit 150.

The inverter circuit 150 includes three semiconductor modules each including the MOSFET 300 of the third embodiment as a switching element. By connecting the three semiconductor modules in parallel, the three-phase inverter circuit 150 having three AC voltage output terminals U, V, and W is achieved.

The motor 140 is driven by AC voltage output from the inverter circuit 150. The motor 140 rotates wheels 90 of the vehicle 1200.

According to the twelfth embodiment, by inclusion of the MOSFET 300 with improved characteristics, the characteristics of the vehicle 1200 are improved.

Thirteenth Embodiment

An elevator of a thirteenth embodiment is an elevator including the semiconductor device of the third embodiment.

Figure 39:
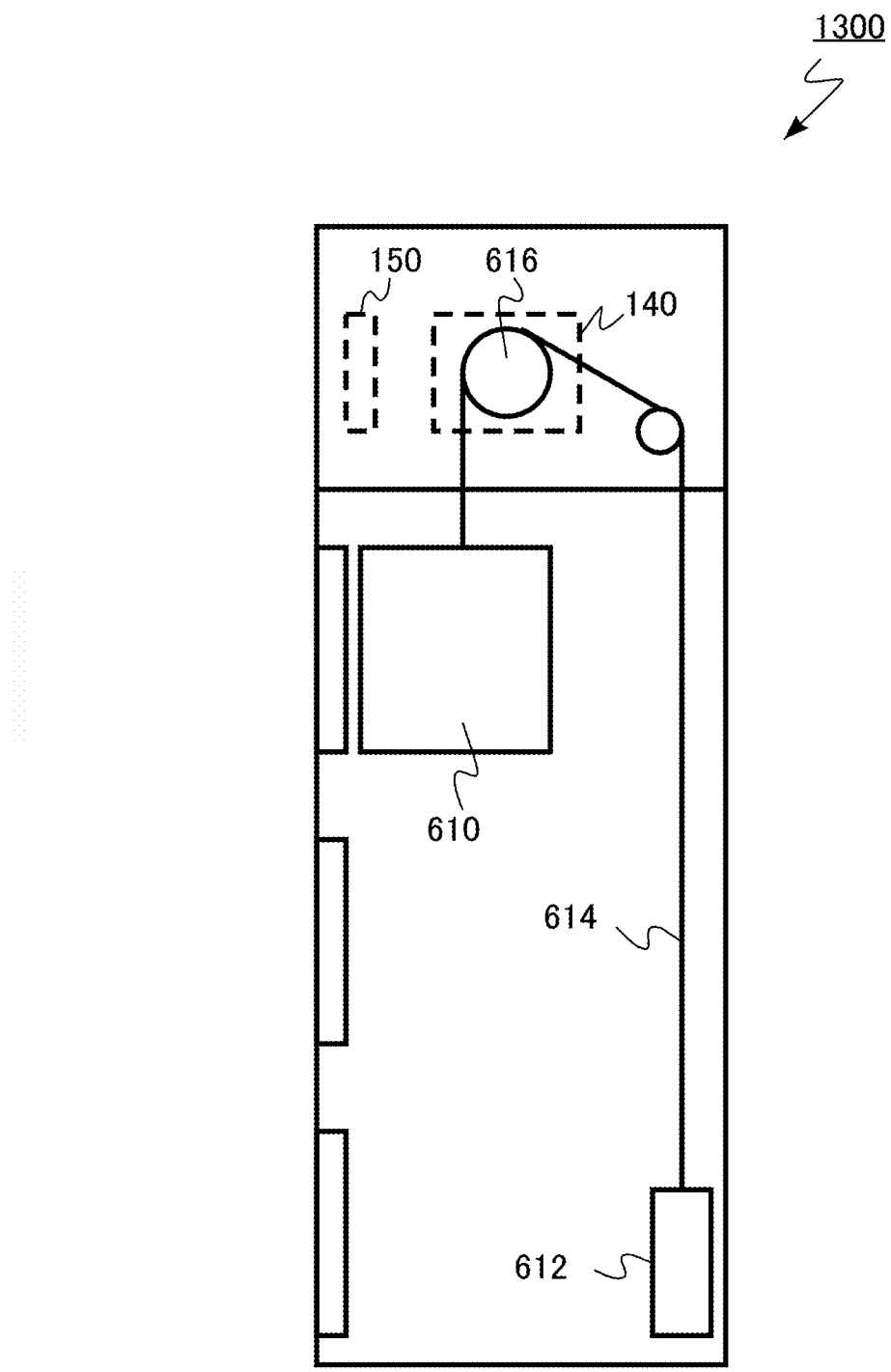
FIG. 39 is a schematic view of an elevator of a thirteenth embodiment.

FIG. 39 is a schematic view of the elevator of the thirteenth embodiment. An elevator 1300 of the thirteenth embodiment includes a car 610, a counterweight 612, a wire rope 614, a hoisting machine 616, a motor 140, and an inverter circuit 150.

The inverter circuit 150 includes three semiconductor modules each including the MOSFET 300 of the third embodiment as a switching element. By connecting the three semiconductor modules in parallel, the three-phase inverter circuit 150 having three AC voltage output terminals U, V, and W is achieved.

The motor 140 is driven by AC voltage output from the inverter circuit 150. The motor 140 rotates the hoisting machine 616, and the car 610 moves up and down.

According to the thirteenth embodiment, by inclusion of the MOSFET 300 with improved characteristics, the characteristics of the elevator 1300 are improved.

As described above, in the first to ninth embodiments, the case of silicon carbide having a crystal structure of 4H—SiC has been exemplified, but the present disclosure can also be applied to silicon carbide having a crystal structure of 3C—SiC or 6H—SiC.

The present disclosure can also be applied to a merged PiN Schottky (MPS) diode. For example, in FIG. 18 of the second embodiment, when the p-type region 26 (third silicon carbide region) is brought into ohmic-contact with the anode electrode 12, an MPS is obtained. At this time, the sulfur region 20 (second silicon carbide region) forms a Schottky contact with a stable barrier between the drift region 18 and the anode electrode 12.

Note that in the first to ninth embodiments, the case where nitrogen or phosphorus is used as n-type impurities has been exemplified, but arsenic (As) or antimony (Sb) can also be applied as n-type impurities.

In addition, in the first to ninth embodiments, the case where aluminum or boron is used as p-type impurities has been exemplified, but gallium (Ga) or indium (In) can also be applied as p-type impurities.

In addition, in the first to ninth embodiments, the case where the element contained in the second silicon carbide region is sulfur (S) has been exemplified, but even when the element contained in the second silicon carbide region is an element other than sulfur (S), that is, selenium (Se), tellurium (Te), titanium (Ti), zirconium (Zr), hafnium (Hf), vanadium (V), niobium (Nb), tantalum (Ta), chromium (Cr), molybdenum (Mo), or tungsten (W), similar functions and effects to those in the case of sulfur can be obtained.

In addition, in the tenth to thirteenth embodiments, the case where the semiconductor device of the present disclosure is applied to a vehicle or an elevator has been exemplified, but the semiconductor device of the present disclosure can also be applied to, for example, a power conditioner of a photovoltaic power generation system.

In addition, in the tenth to thirteenth embodiments, the case where the semiconductor device of the third embodiment is applied has been exemplified, but for example, the semiconductor device of any one of the fourth to ninth embodiments can also be applied.

While certain embodiments have been described, these embodiments have been presented by way of example only, and are not intended to limit the scope of the inventions. Indeed, the semiconductor device, the method for manufacturing a semiconductor device, the inverter circuit, the drive device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first electrode;
a second electrode; and
a silicon carbide layer disposed between the first electrode and the second electrode, and the silicon carbide layer including:
a first silicon carbide region of n-type; and
a second silicon carbide region disposed between the first silicon carbide region and the first electrode, the second silicon carbide region being in contact with the first electrode, the second silicon carbide region containing at least one element selected from the group consisting of sulfur (S), selenium (Se), tellurium (Te), titanium (Ti), zirconium (Zr), hafnium (Hf), vanadium (V), niobium (Nb), tantalum (Ta), chromium (Cr), molybdenum (Mo), and tungsten (W), the second silicon carbide region containing at least one first atom of the at least one element, and the first atom being bonded to four silicon atoms.

2. The semiconductor device according to claim 1, wherein a maximum concentration of the at least one element in the second silicon carbide region is $1\times10^{17}$ cm$^{-3}$ or more and $1\times10^{22}$ cm$^{-3}$ or less.

3. The semiconductor device according to claim 1, wherein a concentration distribution of the at least one element in the first electrode and the second silicon carbide region has a first peak, and a distance between an interface between the first electrode and the second silicon carbide region and the first peak is 50 nm or less.

4. The semiconductor device according to claim 3, wherein a concentration distribution of the at least one element in the first electrode and the second silicon carbide region has a second peak between the first peak and the first silicon carbide region.

5. The semiconductor device according to claim 1, wherein the first electrode contains a metal silicide.

6. The semiconductor device according to claim 1, wherein the silicon carbide layer further including a pair of third silicon carbide regions of p-type interposing the second silicon carbide region, and the pair of third silicon carbide regions being in contact with the first electrode.

7. The semiconductor device according to claim 1, wherein among the at least one element contained in the second silicon carbide region, a ratio of the at least one first atom is higher than a ratio of at least one second atom of the at least one element, the second atom being bonded to four carbon atoms.

8. A semiconductor device comprising:
a first electrode;
a second electrode;
a silicon carbide layer disposed between the first electrode and the second electrode, and the silicon carbide layer including:
a first silicon carbide region of n-type;
a second silicon carbide region disposed between the first silicon carbide region and the first electrode, the second silicon carbide region being in contact with the first electrode, the second silicon carbide region containing at least one element selected from the group consisting of sulfur (S), selenium (Se), tellurium (Te), titanium (Ti), zirconium (Zr), hafnium (Hf), vanadium (V), niobium (Nb), tantalum (Ta), chromium (Cr), molybdenum (Mo), and tungsten (W), and the second silicon carbide region containing at least one first atom of the at least one element, and the first atom being bonded to four silicon atoms;
a third silicon carbide region of p-type disposed between the first silicon carbide region and the first electrode; and
a fourth silicon carbide region of n-type disposed between the third silicon carbide region and the first electrode, the fourth silicon carbide region being in contact with the first electrode, and n-type impurity concentration of the fourth silicon carbide region being higher than n-type impurity concentration of the first silicon carbide region;
a gate electrode disposed on a side of the first electrode of the silicon carbide layer; and
a gate insulating layer disposed between the gate electrode and the third silicon carbide region.

9. The semiconductor device according to claim 8, wherein a maximum concentration of the at least one element in the second silicon carbide region is $1\times10^{17}$ cm$^{-3}$ or more and $1\times10^{22}$ cm$^{-3}$ or less.

10. The semiconductor device according to claim 8, wherein a concentration distribution of the at least one element in the first electrode and the second silicon carbide region has a first peak, and a distance between an interface between the first electrode and the second silicon carbide region and the first peak is 50 nm or less.

11. The semiconductor device according to claim 10, wherein a concentration distribution of the at least one element in the first electrode and the second silicon carbide region has a second peak between the first peak and the first silicon carbide region.

12. The semiconductor device according to claim 8, wherein the first electrode contains a metal silicide.

13. The semiconductor device according to claim 8, wherein a first portion of the first electrode in contact with the second silicon carbide region and a second portion of the first electrode in contact with the fourth silicon carbide region are made of same material.

14. The semiconductor device according to claim 8, wherein among the at least one element contained in the second silicon carbide region, a ratio of the at least one first atom is higher than a ratio of at least one second atom of the at least one element, the second atom being bonded to four carbon atoms.

15. An inverter circuit comprising the semiconductor device according to claim 1.

16. A drive device comprising the semiconductor device according to claim 1.

17. A vehicle comprising the semiconductor device according to claim 1.

18. An elevator comprising the semiconductor device according to claim 1.

* * * * *